(12) United States Patent
Hoshino et al.

(10) Patent No.: US 10,396,702 B2
(45) Date of Patent: Aug. 27, 2019

(54) MOTOR DRIVE CONTROL DEVICE

(71) Applicant: HITACHI AUTOMOTIVE SYSTEMS, LTD., Hitachinaka-shi, Ibaraki (JP)

(72) Inventors: Katsuhiro Hoshino, Hitachinaka (JP); Toshisada Mitsui, Hitachinaka (JP); Seigo Yukutake, Hitachinaka (JP); Hideki Miyazaki, Hitachinaka (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 31 days.

(21) Appl. No.: 15/550,579

(22) PCT Filed: Jan. 20, 2016

(86) PCT No.: PCT/JP2016/051485
§ 371 (c)(1),
(2) Date: Aug. 11, 2017

(87) PCT Pub. No.: WO2016/129338
PCT Pub. Date: Aug. 18, 2016

(65) Prior Publication Data
US 2018/0241340 A1    Aug. 23, 2018

(30) Foreign Application Priority Data

Feb. 12, 2015   (JP) ................. 2015-025572

(51) Int. Cl.
*H02P 23/00*  (2016.01)
*H02P 29/66*  (2016.01)
(Continued)

(52) U.S. Cl.
CPC .......... *H02P 29/662* (2016.11); *G01R 31/343* (2013.01); *G01R 31/346* (2013.01);
(Continued)

(58) Field of Classification Search
CPC . G01R 31/343; G01R 31/346; H02M 7/5387; H02P 25/16; H02P 29/662; H02P 6/12; H02P 6/28
See application file for complete search history.

(56) References Cited

U.S. PATENT DOCUMENTS

2003/0071588 A1* 4/2003 Iwaji .................. H02P 6/12
318/400.01
2012/0212169 A1  8/2012 Wu et al.
(Continued)

FOREIGN PATENT DOCUMENTS

JP    2004-080975 A    3/2004
JP    2014-007851 A    1/2014

OTHER PUBLICATIONS

International Search Report with its English translation and Written opinion issued in corresponding application No. PCT/JP2016/051485 dated May 10, 2016.
(Continued)

*Primary Examiner* — Muhammad S Islam
(74) *Attorney, Agent, or Firm* — Foley & Lardner LLP

(57) ABSTRACT

A motor drive control device is a device which drives and controls a permanent magnet synchronous motor in which each phase is independently controlled, and includes a 0-axis current calculation unit which calculates and outputs a 0-axis current $i_z$ on the basis of a motor current; a 0-axis current determination unit which compares and determines a reference 0-axis current value $i_{zs}$, which is the 0-axis current value when the temperature of a permanent magnet provided in the permanent magnet synchronous motor is a reference temperature with the calculated 0-axis current $i_z$; and a switching signal generation unit which drives and controls inverters on the basis of the result of comparison determination of the 0-axis current determination unit.

8 Claims, 24 Drawing Sheets

(51) Int. Cl.
   *H02P 6/12* (2006.01)
   *H02P 6/28* (2016.01)
   *G01R 31/34* (2006.01)
   *H02M 7/5387* (2007.01)
   *H02P 25/16* (2006.01)

(52) U.S. Cl.
   CPC ............ *H02M 7/5387* (2013.01); *H02P 6/12* (2013.01); *H02P 6/28* (2016.02); *H02P 25/16* (2013.01)

(56) References Cited

U.S. PATENT DOCUMENTS

| | | | |
|---|---|---|---|
| 2014/0054986 A1 | 2/2014 | Hirai et al. | |
| 2015/0162857 A1* | 6/2015 | Ohta | H02P 6/28 318/400.02 |
| 2016/0211767 A1* | 7/2016 | Hotta | H02M 1/08 |
| 2017/0331401 A1* | 11/2017 | Sambonsuge | H02P 27/06 |

OTHER PUBLICATIONS

L De Sousa et al., "Method of evaluating the zero-sequence inductance ratio for electrical machines", 2011, 14$^{th}$ European conference on power electronics and applications (EPE 2011), Birmingham, United Kingdom, Aug. 30, 2011-Sep. 1, 2011, Aug. 30, 2011, pp. 1-10, XP055502639.

Extended European Search Report dated Sep. 10, 2018 in European Patent Application No. 16748983.0.

\* cited by examiner (a) 0-AXIS CURRENT SUPPRESSION CONTROL IS NOT PERFORMED (b) 0-AXIS CURRENT SUPPRESSION CONTROL IS PERFORMED (a)
−40deg.C (b)
100deg.C (c)
180deg.C (a) −40deg.C (b) 100deg.C (c) 180deg.C (d)

DEMAGNETIZATION CURVE
(OPERATING POINT OF PERMANENT MAGNET)

DEMAGNETIZATION CURVE
(OPERATING POINT OF PERMANENT MAGNET)

ELECTRIC ANGLE [deg. el]

MOTOR DRIVE CONTROL DEVICE

TECHNICAL FIELD

The present invention relates to a motor drive control device.

BACKGROUND ART

A permanent magnet synchronous motor with a permanent magnet incorporated therein is used as a driving motor mounted on a hybrid vehicle, an electric vehicle and the like. In some cases, the temperature of the permanent magnet becomes higher or lower than a reference temperature (for example, a designed temperature) of the permanent magnet with drive conditions or use environments of the motor.

In this way, when the temperature of the permanent magnet deviates from the reference temperature, there is a possibility of causing various problems.

For example, when the temperature of the permanent magnets is extremely high, the permanent magnet may cause an irreversible demagnetization. Also, when the temperature of the permanent magnet is extremely high or low, the torque may not fall within a predetermined range in some cases.

For this reason, it is necessary to acquire the temperature of the permanent magnet incorporated in the motor and to drive and control the motor on the basis of the temperature of the acquired permanent magnet. However, in general, since the permanent magnet of the permanent magnet synchronous motor is provided on the rotor, it is difficult to directly detect the temperature. Therefore, it has been considered to estimate the temperature of the permanent magnets incorporated in the motor. For example, PTL 1 discloses an invention for estimating the temperature of a permanent magnet in a 3-phase 3-wire type motor using fundamental waves and harmonics such as current or voltage.

Incidentally, the motor described in PTL 1 cannot independently control each phase due to wiring. In contrast, there is an advantage of being able to independently control each phase in a 3-phase 6-wire type motor (generally, an n-phase 2n-wire type motor, n is an integer of 2 or more), and the utilization range has expanded in recent years.

CITATION LIST

Patent Literature

PTL 1: Japanese Unexamined Patent Application No. 2014-7851

SUMMARY OF INVENTION

Technical Problem

However, even in the permanent magnet synchronous motor that can independently control each phase, there is an aforementioned problem caused by deviation of the temperature of the permanent magnet from the reference temperature.

Solution to Problem

According to a preferred embodiment of the present invention, there is provided a motor drive control device of a permanent magnet synchronous motor in which each phase is independently controlled, in which the motor drive control device includes a smoothing capacitor interposed between a battery configured to supply electric power to the permanent magnet synchronous motor and the permanent magnet synchronous motor to smoothen the current; an inverter interposed between the smoothing capacitor and the permanent magnet synchronous motor to convert a DC bus current flowing on the smoothing capacitor side into a multiphase motor current and supply the multiphase motor current to the permanent magnet synchronous motor; a 0-axis current calculation unit which calculates and outputs a 0-axis current on the basis of one of the motor current and the DC bus current; a comparison determination unit which compares and determines a reference 0-axis current value when the temperature of the permanent magnet provided in the permanent magnet synchronous motor is a reference temperature with the calculated 0-axis current; and a drive control unit which drives and controls the inverter on the basis of the result of the comparison determination of the comparison determination unit.

Advantageous Effects of Invention

According to the present invention, it is possible to provide a motor drive control device which is capable of properly driving and controlling a permanent magnet synchronous motor capable of independently controlling each phase in accordance with the temperature of the permanent magnet.

DESCRIPTION OF EMBODIMENTS

An embodiment in which the present invention is applied to a vehicle such as a hybrid vehicle (HEV) or an electric vehicle (EV) will be described below.

First Embodiment

Figure 1:
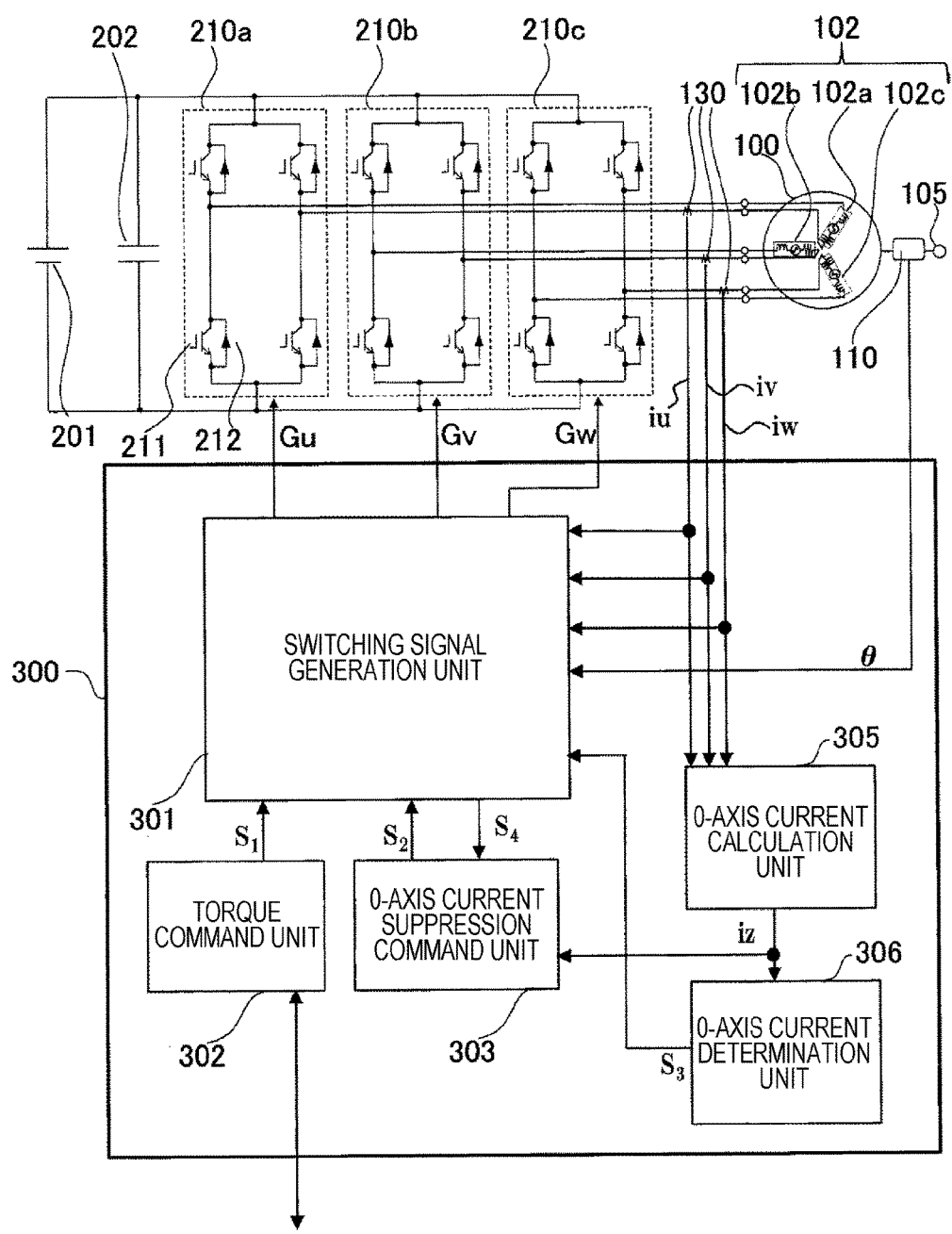
FIG. 1 is a configuration diagram of a motor drive control device that drives and controls a 3-phase 6-wire type permanent magnet synchronous motor.

FIG. 1 illustrates a 3-phase 6-wire type permanent magnet synchronous motor 100 (hereinafter, simply referred to as a motor 100), and a motor drive control device 500 of a first embodiment.

A configuration of the motor 100 will be described. The motor 100 includes a rotor (not illustrated), and a stator (not illustrated) disposed apart from the rotor by a predetermined distance. A permanent magnet (not illustrated) is disposed in the rotor of the motor 100 in a circumferential direction, and the polarities of the adjacent permanent magnets are opposite to each other. Although an armature winding 102 is illustrated in FIG. 1 in a simplified manner, the armature winding 102 is provided in a slot of a stator (not illustrated) of the motor 100. The motor 100 is a 3-phase 6-wire type motor, and unlike a normal 3-phase motor, armature windings of respective phases are not connected to each other as in a Y connection or a delta connection. Both ends of the armature windings 102 of each phase are connected to a full bridge inverter of each phase which will be described later. Therefore, the currents of the respective phases of a U-phase, a V-phase, and a W-phase flow through different armature windings 102, respectively. Hereinafter, the armature windings 102 through which the currents of the U-phase, the V-phase, and the W-phase flows are referred to as armature windings 102a, 102b, and 102c, respectively. In this way, since the currents of the respective phases flow through different armature windings 102 in the motor 100, respectively, the respective phases are controlled independently. The electric conduction to the armature winding 102 will be described later. The rotor rotates by the currents of each phase flowing through the armature winding 102. The motor 100 is provided with a motor output shaft 105 for transmitting rotational power of the motor to an external device (not illustrated).

The motor drive control device 500 is a device for driving and controlling the motor 100. The motor drive control device 500 includes a battery 201, a smoothing capacitor 202, a U-phase full bridge inverter 210a, a V-phase full bridge inverter 210b, a W-phase full bridge inverter 210c, a current detection unit 130, a magnetic pole position detection device 110, and an inverter control device 300.

The battery 201 is a DC electric power supply which supplies electric power to the motor 100.

The U-phase full bridge inverter 210a, the V-phase full bridge inverter 210b, and the W-phase full bridge inverter 210c convert the DC electric power of the battery 201 into 3-phase AC electric power, using a switching element having an IGBT 211 and a diode 212. As illustrated in FIG. 1, the U-phase full bridge inverter 210a is connected to both ends of the U-phase armature winding 102a. The V-phase full bridge inverter 210b is connected to both ends of the V-phase armature winding 102b. The W-phase full bridge inverter 210c is connected to both ends of the W-phase armature winding 102c. Since the armature windings 102 of the respective phases are connected to the different full bridge inverters in this way, current can be controlled independently for each phase. The U-phase full bridge inverter 210a, the V-phase full bridge inverter 210b, and the W-phase full bridge inverter 210c perform switching drive based on switching signals Gu, Gv, and Gw to be described later, respectively, and perform electric conduction to the motor 100.

The smoothing capacitor 202 is provided to be closer to the battery 201 side than the U-phase full bridge inverter 210a, the V-phase full bridge inverter 210b, and the W-phase full bridge inverter 210c. The smoothing capacitor 202 is provided to suppress the disturbance of the current when the inverters 210a, 210b, and 210c are switched and to make the current smooth.

The current detection unit 130 is provided in each of the armature windings 102a, 102b, and 102c of each phase to detect currents flowing through the armature windings 102a, 102b, and 102c. The detected current values $i_u$, $i_v$, and $i_w$ are output to the inverter control device 300.

The magnetic pole position detection device 110 detects the magnetic pole position of the rotor of the motor 100, and outputs the rotation angle θ obtained from the magnetic pole position to the inverter control device 300.

The inverter control device 300 includes a switching signal generation unit 301, a torque command unit 302, a 0-axis current suppression command unit 303, a 0-axis current calculation unit 305, and a 0-axis current determination unit 306. In addition, "0-axis" reads as "zero axis".

The torque command unit 302 communicates with an external device (for example, a host controller), and outputs the torque command signal $S_1$ to the switching signal generation unit 301.

The current values $i_u$, $i_v$, and $i_w$ output from the current detection unit 130 are input to the switching signal generation unit 301 and the 0-axis current calculation unit 305. Normally, the switching signal generation unit 301 performs the 0-axis current suppression control, and stops the 0-axis current suppression control only when obtaining the 0-axis current $i_z$. As will be described later, the 0-axis current suppression command unit 303 instructs the switching signal generation unit 301 to perform the 0-axis current suppression control.

The 0-axis current calculation unit 305 calculates the following formula (1) on the basis of the received current values $i_u$, $i_v$, and $i_w$ to obtain the 0-axis current $i_z$.

[Formula 1]

$$i_z = \frac{1}{\sqrt{3}}(i_u + i_v + i_w) \quad (1)$$

The 0-axis current calculation unit 305 outputs the current value of the 0-axis current $i_z$ to the 0-axis current determination unit 306 and the 0-axis current suppression command unit 303.

The 0-axis current determination unit 306 performs determination on the basis of the received 0-axis current $i_z$. In the present embodiment, the 0-axis current determination unit 306 uses a third-order component which is a main component of the received 0-axis current $i_z$ as a determination material (see FIG. 6), and determines as to which region of a plurality of preset regions the third-order component enters (see FIG. 12). A determination signal $S_2$ indicating the determination result thereof is output to the switching signal generation unit 301.

Normally, the 0-axis current suppression command unit 303 outputs the 0-axis current suppression command signal $S_2$ to the switching signal generation unit 301 so as to remove the 0-axis current $i_z$ on the basis of the current value of the received 0-axis current $i_z$. When the 0-axis current $i_z$ is obtained, the 0-axis current suppression command unit 303 does not output the 0-axis current suppression command signal $S_2$. The 0-axis current suppression command unit 303 receives a signal $S_4$ including information on the torque and the rotational speed of the motor 100 from the switching signal generation unit 301, and determines the frequency at which the 0-axis current suppression control is not performed, on the basis of the signal $S_4$.

The switching signal generation unit 301 receives the current values $i_u$, $i_v$, and $i_w$, the rotation angle θ, the torque command signal $S_1$, the 0-axis current suppression command signal $S_2$, and the determination signal $S_3$ related to the 0-axis current $i_z$. Further, the switching signal generation unit 301 performs calculation processing based on the information, obtains the switching signals Gu, Gv, and Gw and outputs the switching signals to the full bridge inverters 210a, 210b, and 210c.

Before specifically describing the generation of the switching signals Gu, Gv, and Gw in the switching signal generation unit 301, the following assumed description will be given.

A general 3-phase 3-wire type permanent magnet synchronous motor (3-phase 3-wire type Y connection) will be described. Thereafter, a 3-phase 6-wire type permanent magnet synchronous motor according to the present embodiment will be described.

The voltage formula of a general 3-phase permanent magnet synchronous motor is represented by the following formula (2).

[Formula 2]

$$\begin{bmatrix} v_u \\ v_v \\ v_w \end{bmatrix} = R \begin{bmatrix} i_u \\ i_v \\ i_w \end{bmatrix} + p \begin{bmatrix} L_u & M_{uv} & M_{uw} \\ M_{vu} & L_v & M_{vw} \\ M_{wu} & M_{wv} & L_w \end{bmatrix} \begin{bmatrix} i_u \\ i_v \\ i_w \end{bmatrix} + \begin{bmatrix} e_u \\ e_v \\ e_w \end{bmatrix} \quad (2)$$

The components of the matrix in formula (2) are the following formulae (3), (4) and (5).

[Formula 3]

$$\begin{bmatrix} e_u \\ e_v \\ e_w \end{bmatrix} = \begin{bmatrix} -\omega_e \psi_m \sin(\theta) \\ -\omega_e \psi_m \sin\left(\theta - \frac{2\pi}{3}\right) \\ -\omega_e \psi_m \sin\left(\theta + \frac{2\pi}{3}\right) \end{bmatrix} \quad (3)$$

[Formula 4]

$$\left.\begin{array}{l} L_u = l_a + L_a + L_{as}\cos(2\theta) \\ L_v = l_a + L_a + L_{as}\cos\left(2\theta + \frac{2\pi}{3}\right) \\ L_w = l_a + L_a + L_{as}\cos\left(2\theta - \frac{2\pi}{3}\right) \end{array}\right\} \quad (4)$$

[Formula 5]

$$\left.\begin{array}{l} M_{uv} = M_{vu} = -\frac{1}{2}L_a - L_{as}\cos\left(2\theta - \frac{2\pi}{3}\right) \\ M_{vw} = M_{wv} = -\frac{1}{2}L_a - L_{as}\cos(2\theta) \\ M_{wu} = M_{uw} = -\frac{1}{2}L_a - L_{as}\cos\left(2\theta + \frac{2\pi}{3}\right) \end{array}\right\} \quad (5)$$

Here, $v_u$, $v_v$, and $v_w$: voltage of u, v, and w-phase
$i_u$, $i_v$, and $i_w$: current of u, v, and w-phase
$v_d$, $v_q$, and $v_z$: voltage of d, q, and 0-axis
$i_d$, $i_q$, and $i_z$: current of d, q, and 0-axis
R: winding resistance of 1-phase
P=d/dt: differential operator
$\phi_m \propto B_m$: linkage magnetic flux of permanent magnet
$B_m$: magnetic flux density of permanent magnet
$\omega_e$=dθ/dt: electric angular velocity motor shaft revolution
$e_u$, $e_v$, and $e_w$: induced voltage of u, v, and w-phase
$L_u$, $L_v$, and $L_w$: self-inductance of u, v, and w-phase
$M_{uv}$, $M_{uw}$, $M_{vu}$, $M_{vw}$, $M_{wu}$, and $M_{wv}$: mutual inductance
$l_a$: leakage inductance of 1-phase
$L_a$: average value of effective inductance of 1-phase
$L_{as}$: amplitude component of effective inductance of 1-phase.

The connection structure of the permanent magnet synchronous motor is a generally 3-phase Y connection. When voltage is applied to the permanent magnet synchronous motor in a 3-phase inverter, since voltage is applied between the lines at the motor terminal, there are following features. A first feature is that the applied voltage does not include harmonic components of 3n order (n is a positive integer). A second feature is that, by the rotation of the rotor provided with the permanent magnet of the permanent magnet synchronous motor to which the voltage is applied, induced voltage caused by a temporal change in the amount of magnetic flux interlinked with the armature winding of the stator also does not include the 3n order harmonic. From these features, the current sum $i_u+i_v+i_w=0$ of each phase always holds.

Upon obtaining various command values for motor control, the uvw 3-phase coordinate system is changed to the dq rotational coordinate system. The conversion matrix from the uvw 3-phase coordinate system to the dq rotational coordinate system is the following formula (6).

[Formula 6]

$$C_3 = \sqrt{\frac{2}{3}} \begin{bmatrix} \cos(\theta) & \cos(\theta - 2\pi/3) & \cos(\theta + 2\pi/3) \\ -\sin(\theta) & -\sin(\theta - 2\pi/3) & -\sin(\theta + 2\pi/3) \end{bmatrix} \quad (6)$$

When the above formula (2) is converted using the above formula (6), the following formula (7) is obtained.

[Formula 7]

$$\begin{bmatrix} v_d \\ v_q \end{bmatrix} = R \begin{bmatrix} i_d \\ i_q \end{bmatrix} + \begin{bmatrix} pL_d & -\omega L_q \\ \omega L_d & pL_q \end{bmatrix} \begin{bmatrix} i_d \\ i_q \end{bmatrix} + \begin{bmatrix} 0 \\ e_a \end{bmatrix} \quad (7)$$

The voltage in the dq rotational coordinate system is converted as in the following formula (8).

[Formula 8]

$$\begin{bmatrix} v_d \\ v_q \end{bmatrix} = \sqrt{\frac{2}{3}} \begin{bmatrix} \cos(\theta) & \cos(\theta - 2\pi/3) & \cos(\theta + 2\pi/3) \\ -\sin(\theta) & -\sin(\theta - 2\pi/3) & -\sin(\theta + 2\pi/3) \end{bmatrix} \begin{bmatrix} v_u \\ v_v \\ v_w \end{bmatrix} \quad (8)$$

Further, the current in the dq rotational coordinate system is converted as in the following formula (9).

[Formula 9]

$$\begin{bmatrix} i_d \\ i_q \end{bmatrix} = \sqrt{\frac{2}{3}} \begin{bmatrix} \cos(\theta) & \cos(\theta - 2\pi/3) & \cos(\theta + 2\pi/3) \\ -\sin(\theta) & -\sin(\theta - 2\pi/3) & -\sin(\theta + 2\pi/3) \end{bmatrix} \begin{bmatrix} i_u \\ i_v \\ i_w \end{bmatrix} \quad (9)$$

As described above, in a general 3-phase 3-wire type permanent magnet synchronous motor, by conversion from the uvw 3-phase coordinate system to the dq rotational coordinate system, it is possible to perform the torque control of the motor with two variables of the current $i_d$ and $i_q$ in the dq rotational coordinate.

In contrast, the 3-phase 6-wire type permanent magnet synchronous motor 100 is different in conditions from a general 3-phase 3-wire type permanent magnet synchronous motor.

The voltage formula of the 3-phase 6-wire type permanent magnet synchronous motor 100 is the above formula (2). Since voltage can be applied independently for each phase, the voltage can include 3n-order harmonic components, and thus, the degree of freedom of the applied voltage increases. In the 3-phase 6-wire type permanent magnet synchronous motor 100, in addition to the voltage applied by the inverter, the induced voltage sometimes also includes the 3n-order harmonic component.

The current i flowing through the permanent magnet synchronous motor is generated by a difference between the induced voltage e caused by the permanent magnet and the voltage v applied by the inverter. Therefore, even when the applied voltage v of the inverter does not include a harmonic component, if a harmonic component is included in the induced voltage e, a harmonic component is included in the flowing current.

Therefore, the current sum $i_u + i_v + i_w = 0$ of each phase is not necessarily limited, and formula (2) which is the voltage formula relating to $v_u$, $v_v$, and $v_w$ is converted into the following formula (10) which is a formula of the transformation matrix, and becomes a voltage formula relating to $v_d$, $v_q$, and $v_z$ represented in the following formula (11).

[Formula 10]

$$C_6 = \sqrt{\frac{2}{3}} \begin{bmatrix} \cos(\theta) & \cos(\theta - 2\pi/3) & \cos(\theta + 2\pi/3) \\ -\sin(\theta) & -\sin(\theta - 2\pi/3) & -\sin(\theta + 2\pi/3) \\ 1/\sqrt{2} & 1/\sqrt{2} & 1/\sqrt{2} \end{bmatrix} \quad (10)$$

[Formula 11]

$$\begin{bmatrix} v_d \\ v_q \\ v_z \end{bmatrix} = R \begin{bmatrix} i_d \\ i_q \\ i_z \end{bmatrix} + \begin{bmatrix} pL_d & -\omega L_q & 0 \\ \omega L_d & pL_q & 0 \\ 0 & 0 & pL_z \end{bmatrix} \begin{bmatrix} i_d \\ i_q \\ i_z \end{bmatrix} + \begin{bmatrix} 0 \\ e_a \\ e_z \end{bmatrix} \quad (11)$$

Further, the voltage and the current are converted as represented in the following formulae (12) and (13).

[Formula 12]

$$\begin{bmatrix} v_d \\ v_q \\ v_z \end{bmatrix} = \sqrt{\frac{2}{3}} \begin{bmatrix} \cos(\theta) & \cos(\theta - 2\pi/3) & \cos(\theta + 2\pi/3) \\ -\sin(\theta) & -\sin(\theta - 2\pi/3) & -\sin(\theta + 2\pi/3) \\ 1/\sqrt{2} & 1/\sqrt{2} & 1/\sqrt{2} \end{bmatrix} \begin{bmatrix} v_u \\ v_v \\ v_w \end{bmatrix} \quad (12)$$

[Formula 13]

$$\begin{bmatrix} i_d \\ i_q \\ i_z \end{bmatrix} = \sqrt{\frac{2}{3}} \begin{bmatrix} \cos(\theta) & \cos(\theta - 2\pi/3) & \cos(\theta + 2\pi/3) \\ -\sin(\theta) & -\sin(\theta - 2\pi/3) & -\sin(\theta + 2\pi/3) \\ 1/\sqrt{2} & 1/\sqrt{2} & 1/\sqrt{2} \end{bmatrix} \begin{bmatrix} i_u \\ i_v \\ i_w \end{bmatrix} \quad (13)$$

As understood from the above formulae (11), (12), and (13), the 3-phase 6-wire type permanent magnet synchronous motor 100 performs the control in a system in which the 0-axis is added to the normal d-axis and q-axis (a dq0 rotational coordinate system). As understood from the formula (13), the torque control of the 3-phase 6-wire type permanent magnet synchronous motor 100 is performed by three variables in which the 0-axis current $i_z$ as current of the 0-axis=$(i_u+i_v+i_w)/\sqrt{3}$, that is, the 0-axis current $i_z$ represented by the above formula (1) is added as the third control variable.

The generation of the switching signals Gu, Gv, and Gw in the switching signal generation unit 301 will be specifically described. The switching signal generation unit 301 converts the current values $i_u$, $i_v$, and $i_w$ into the currents $i_d$, $i_q$, and $i_z$ of the dq0 rotational coordinate system, using the formula (13). In order to perform this conversion, information on the rotation angle θ is required as illustrated in the matrix of the formula (13).

When the 0-axis current suppression command is issued by the 0-axis current suppression command signal $S_2$ (hereinafter, also referred to as "at the time of suppression"), the switching signal generation unit 301 performs the correction of eliminating the 0-axis current $i_z$ on the currents $i_d$, $i_q$, and $i_z$. The switching signal generation unit 301 does not perform the above correction when the 0-axis current suppression command $S_2$ is not issued (hereinafter, also referred to as "at the time of non-suppression").

The switching signal generation unit 301 changes the current $i_d$ and $i_q$ to the target value, on the basis of the determination signal $S_3$, the torque command signal $S_1$, the driving policy of the motor 100 (how much the reluctance torque is included, and the like), and the following formula (14).

[Formula 14]

$$T = P_p \psi_m i_q + P_p (L_d - L_q) i_d i_q \quad (14)$$

Here,
$L_d$ and $L_q$: self-inductance of d-axis and q-axis
$P_p$: number of pole pairs of motor
T: Torque.

The determination signal $S_3$ is a signal for performing the correction relating to the drive and control of the motor 100. The determination signal $S_3$ of the present embodiment is a command signal for stabilizing the torque by keeping the torque at a constant value. The command using the determination signal $S_3$ will be described later.

The output $P_{OUT}$ of the motor 100 is obtained by the following formula (15).

[Formula 15]

$$P_{OUT} = \omega_m \cdot T \qquad (15)$$

Here,
$\omega_m = \omega_e/P_p$: Motor shaft angular velocity

Through the aforementioned steps, target current values $i_d$, $i_q$, and $i_z$ are determined. The switching signal generation unit 301 obtains the target current values $i_u$, $i_v$, and $i_w$ of the uvw 3-phase coordinate system, by performing inverse transformation of Formula (13) on the target current values $i_d$, $i_q$, and $i_z$. The switching signal generation unit 301 generates the switching signals Gu, Gv, and Gw, on the basis of the target current values $i_u$, $i_v$, and $i_w$ of the uvw 3-phase coordinate system.

Further, the switching signal generation unit 301 transmits a signal $S_4$ including information on the torque and the rotational speed of the motor 100 to the 0-axis current suppression command unit 303. The 0-axis current suppression command unit 303 determines the frequency of the 0-axis current suppression control based on the signal $S_4$.

Figure 2:
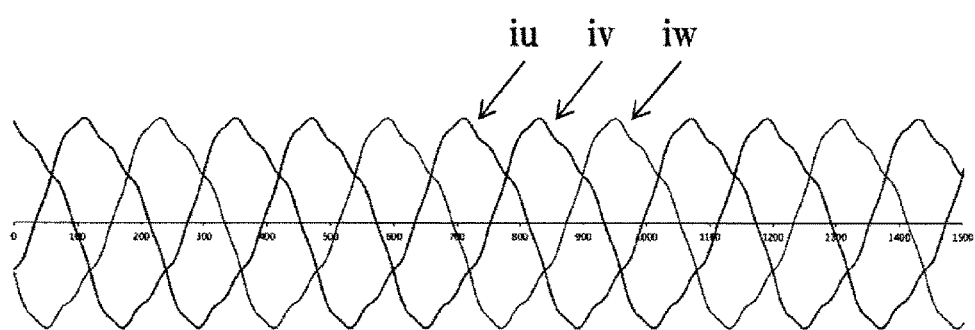
FIGS. 2(a) and 2(b) are diagrams illustrating each phase current waveform for illustrating a 0-axis current suppression control.
Figure 2:
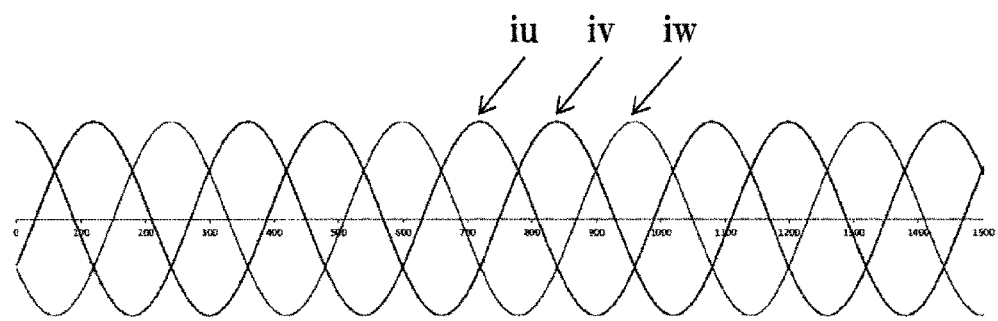

FIGS. 2(a) and 2(b) are diagrams illustrating the 0-axis current suppression control of the motor 100.

As described above, the switching signal generation unit 301 normally performs the 0-axis current suppression control.

The reason is as follows. As illustrated in FIG. 2(a), the 0-axis current $i_z$ is superimposed as a harmonic component of the current and has a waveform distorted from the sinusoidal wave. In general, since such a harmonic component of the current causes an increase in torque ripple of the motor, an increase in noise vibration, a deterioration in loss and the like, it is preferable to reduce the harmonic component.

Therefore, in general, a harmonic component is superimposed on the inverter output voltage v and applied to the motor 100 to cancel the harmonic component of the induced voltage e, thereby performing a control, that is, 0-axis current suppression control to make the 0-axis current $i_z$=0 flowing through the motor. The current waveform of each phase when performing the 0-axis current suppression control is a sinusoidal wave as illustrated in FIG. 2(b).

As described above, the 0-axis current $i_z$ causes an increase in torque ripple of the motor, an increase in noise vibration, deterioration in loss, and the like. Therefore, the switching signal generation unit 301 normally suppresses the 0-axis current $i_z$ by the 0-axis current suppression control.

However, as will be described later, since the temperature of the permanent magnet provided in the rotor of the motor 100 can be estimated on the basis of the 0-axis current $i_z$, the present embodiment is set so as not to perform the 0-axis current suppression control, when detecting the 0-axis current $i_z$.

Figure 3:
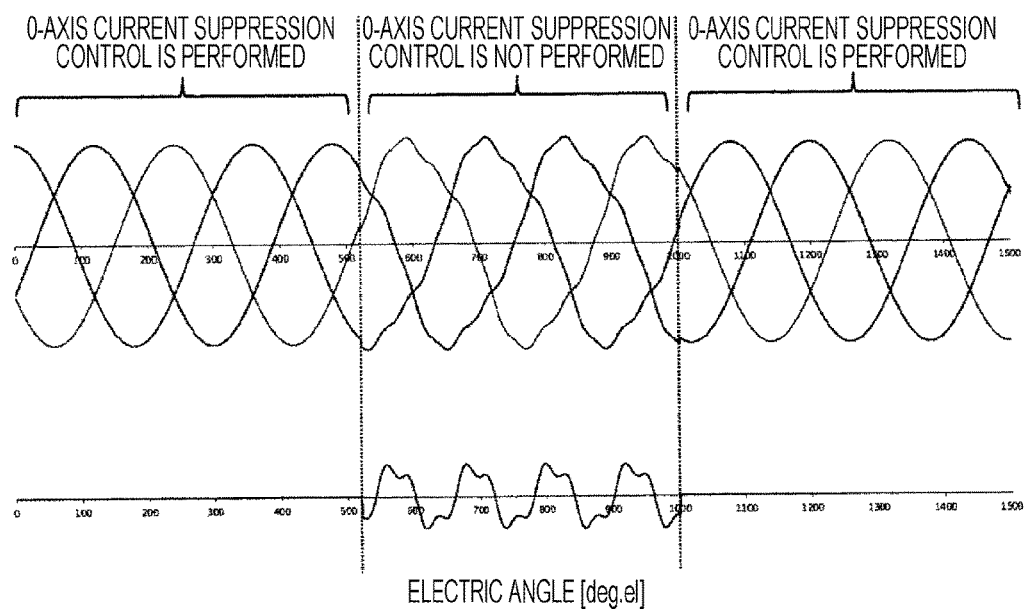
FIG. 3 is a diagram illustrating a control performed when detecting a current for obtaining the 0-axis current.

FIG. 3 illustrates an aspect in which the 0-axis current is detected during the period when the 0-axis current suppression control is stopped. In accordance with the signal $S_4$ received from the switching signal generation unit 301, the 0-axis current suppression command unit 303 changes the frequency of setting the above period. For example, when the motor 100 is used at an operating point with a large load such as when generating a large torque or when rotating at high speed, the temperature change of the magnet is often large. In the present embodiment, the 0-axis current suppression command unit 303 obtains the information on the torque or the rotational speed from the signal $S_4$ to monitor the load condition of the motor 100, and at the time of high load of the motor 100, the frequency of providing the period and the detection frequency of the 0-axis current $i_z$ are set to be higher than that at the time of the normal operation.

Figure 4:
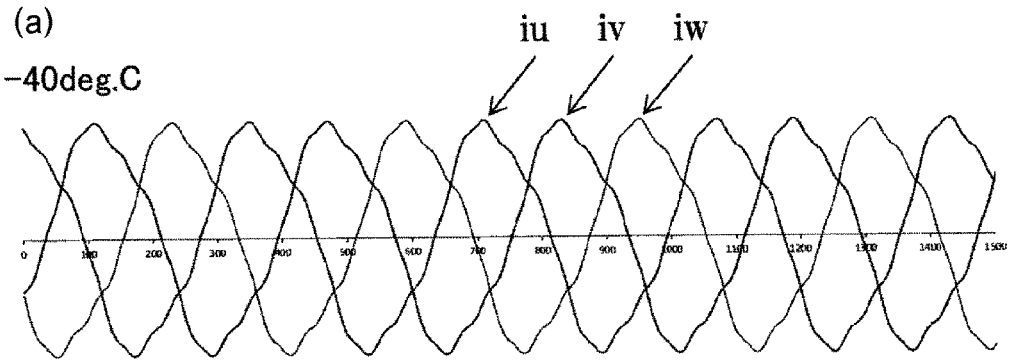
FIGS. 4(a) to 4(c) are diagrams illustrating a temperature dependency of each phase current waveform which is not subjected to a 0-axis current suppression control.
Figure 4:
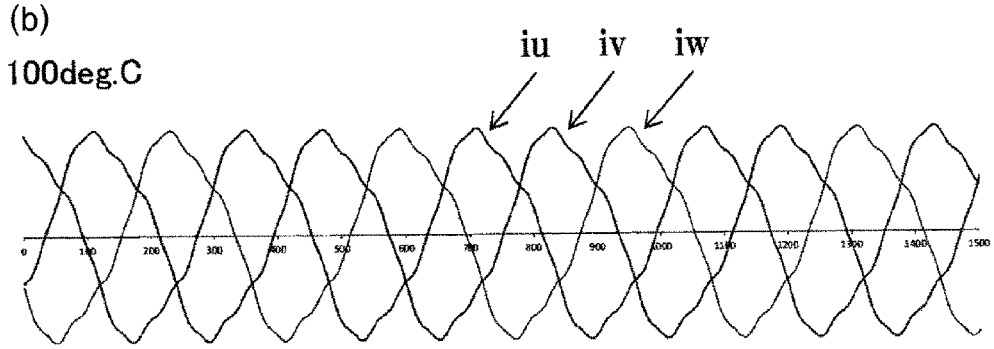
Figure 4:
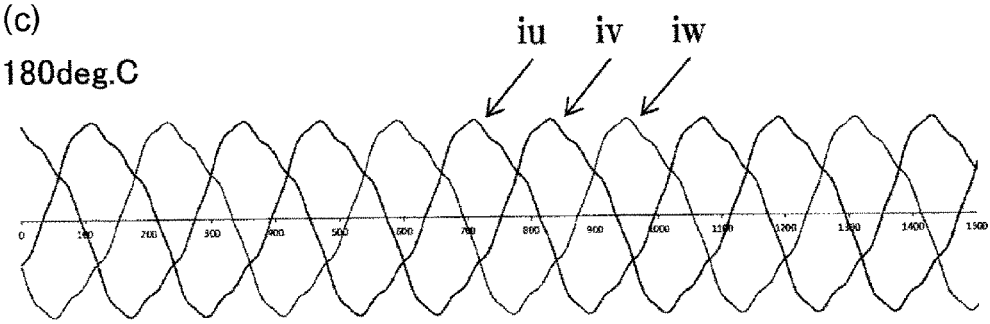

FIGS. 4(a) to 4(c) illustrate the current waveform of the armature winding 102 of the motor 100 when the 0-axis current suppression control is not performed, and illustrates the current waveform at each temperature of the permanent magnet provided in the rotor of the motor 100. FIGS. 4(a), 4(b) and 4(c) illustrate the results of −40 deg. C., 100 deg. C., and 180 deg. C., respectively. It is understood that, as the temperature of the permanent magnet rises from the low temperature to the high temperature, the amplitude of the current waveform of each phase decreases.

Figure 5:
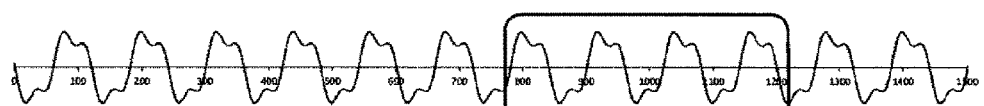
FIGS. 5(a) to 5(d) are diagrams illustrating the temperature dependency of the 0-axis current waveform.
Figure 5:
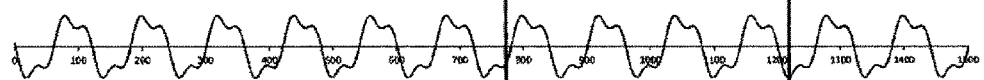
Figure 5:
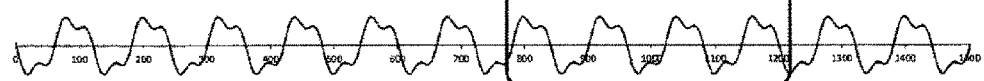
Figure 5:
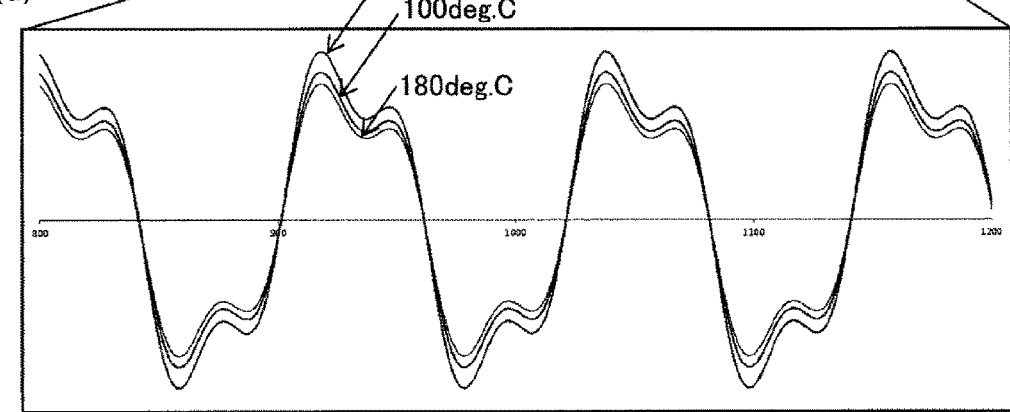

In FIGS. 5(a) to 5(d), only the current waveform of the 0-axis current $i_z$ is extracted from the current waveform illustrated in FIGS. 4(a) to 4(c). FIGS. 5(a), 5(b) and 5(c) illustrate the current waveforms of −40 deg. C., 100 deg. C., and 180 deg. C., respectively. FIG. 5(d) illustrates the current waveforms of FIGS. 5(a), 5(b) and 5(c) in a superimposed manner for comparison. As illustrated in FIG. 5(d), it is understood that, as the temperature of the permanent magnet rises from a low temperature to a high temperature, the amplitude of the current waveform decreases.

Figure 6:
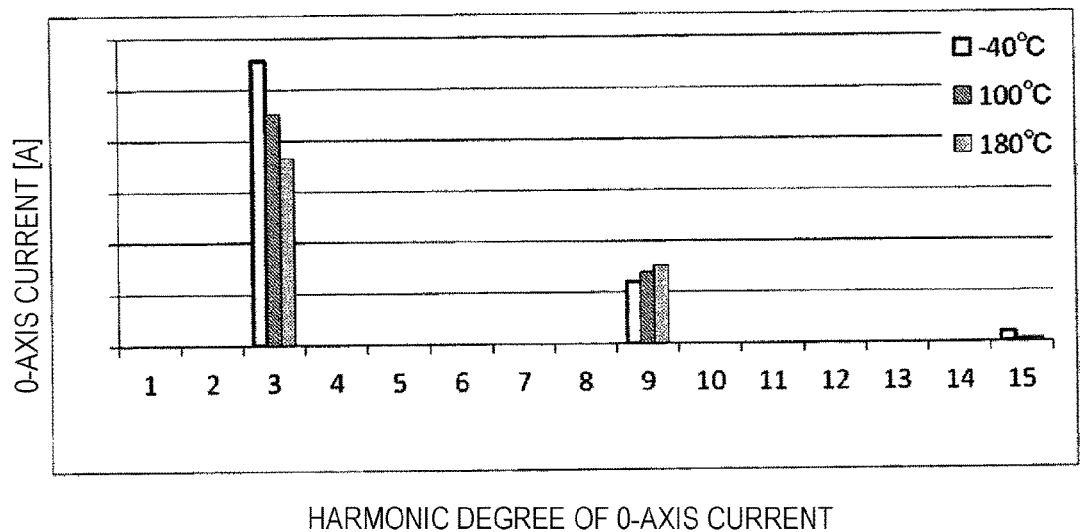
FIG. 6 is a diagram illustrating harmonic analysis results of the 0-axis current waveform.

FIG. 6 illustrates a harmonic analysis of the current waveform of the 0-axis current $i_z$ at each temperature illustrated in FIGS. 5(a) to 5(d). As illustrated in FIG. 6, it is understood that the 3-order component which is the main component of the 0-axis current $i_z$ decreases with the temperature rise. In the present embodiment, the 3-order component is used as a determination material relating to the 0-axis current $i_z$. Other components may be used as needed.

Figure 7:
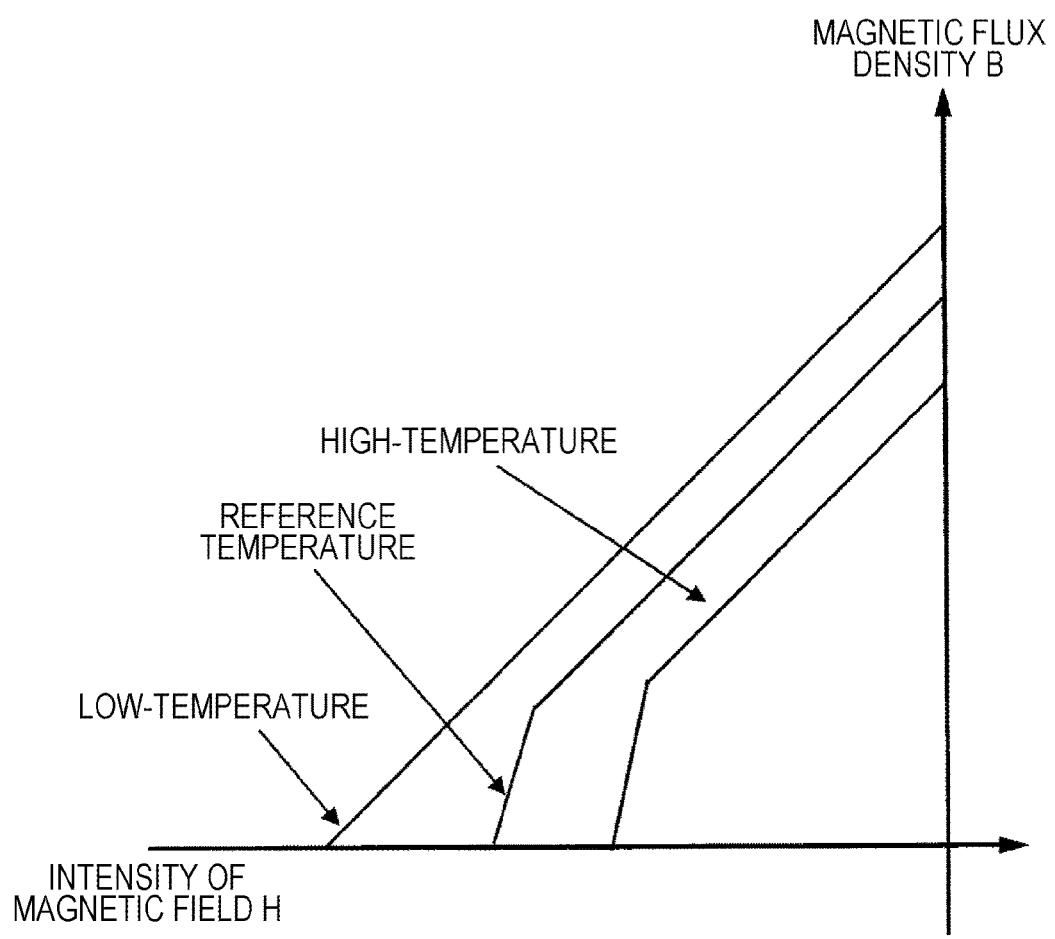
FIG. 7 is a diagram illustrating the temperature dependency of a demagnetization curve of a permanent magnet.

FIG. 7 illustrates the demagnetization curves of the permanent magnets at each temperature. As illustrated in FIG. 7, it is understood that, as the temperature rises, the value of the magnetic flux density $B_m$ of the permanent magnet decreases.

Figure 8:
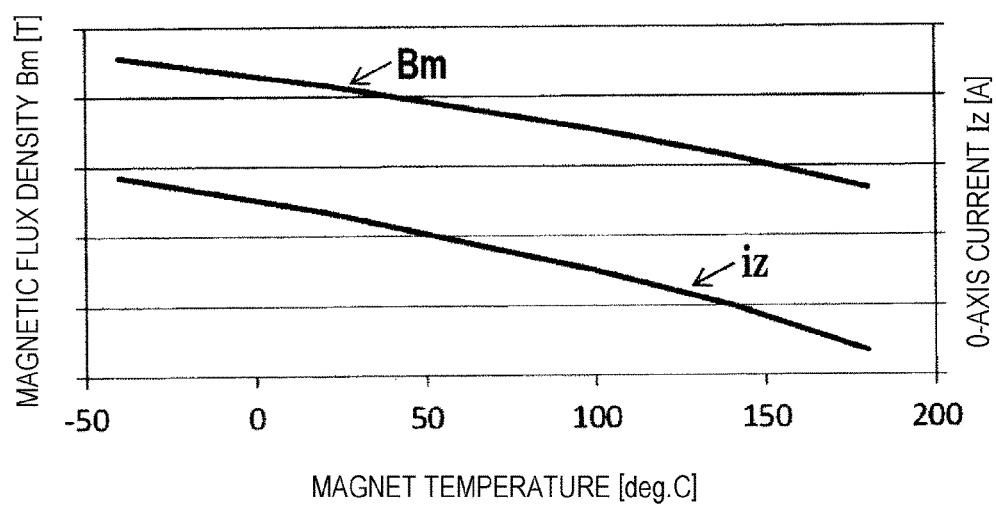
FIG. 8 is a diagram illustrating a relation between a permanent magnetic flux density and a 0-axis current with respect to the temperature of the permanent magnet.

FIG. 8 illustrates a relation between the 0-axis current $i_z$ and the magnetic flux density $B_m$ of the permanent magnet with respect to the temperature of the permanent magnet. As illustrated in FIG. 8, it is understood that the value of the 0-axis current $i_z$ and the value of the magnetic flux density $B_m$ of the permanent magnet are reduced with the temperature rise of the permanent magnet.

Figure 9:
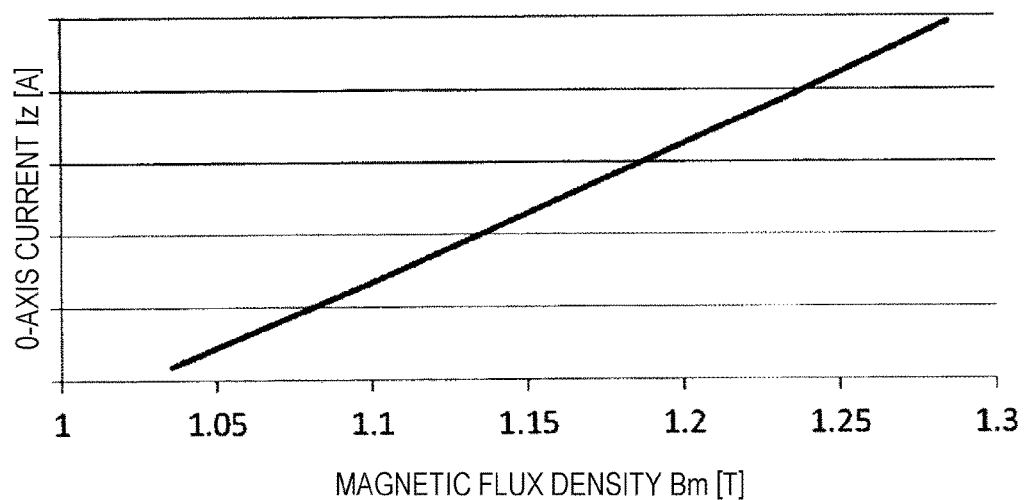
FIG. 9 is a diagram illustrating a relation between a magnetic flux density of a permanent magnet and the 0-axis current.

FIG. 9 illustrates a relation between the 0-axis current $i_z$ and the magnetic flux density $B_m$ of the permanent magnet. It is understood that, as the magnetic flux density $B_m$ of the permanent magnet increases, the 0-axis current $i_z$ increases.

From the above, it is understood that there is a correlation between the temperature of the permanent magnet, the magnetic flux density $B_m$ of the permanent magnet, and the 0-axis current $i_z$. By mapping or making a function of the correlation using this fact, it is possible to estimate the temperature of the permanent magnet and the magnetic flux density $B_m$ of the permanent magnet from the 0-axis current $i_z$.

The 0-axis current determination unit 306 of the inverter control device 300 used in the motor drive control device 500 of the present embodiment does not estimate the temperature of the permanent magnet and the magnetic flux density $B_m$ of the permanent magnet, using the 0-axis current $i_z$. The 0-axis current determination unit 306 of the present embodiment has a 0-axis current determination criterion (see FIG. 12) set based on the temperature of the permanent magnet, and determines the obtained 0-axis current $i_z$ by the criterion. As described above, since the criterion is set based on the temperature of the permanent magnet, it is possible to consider that determination based on the criterion is substantially estimation of the temperature of the permanent magnet.

Before describing the determination of the 0-axis current determination unit 306 in the present embodiment, the temperature dependency of the motor torque will be described.

Figure 10:
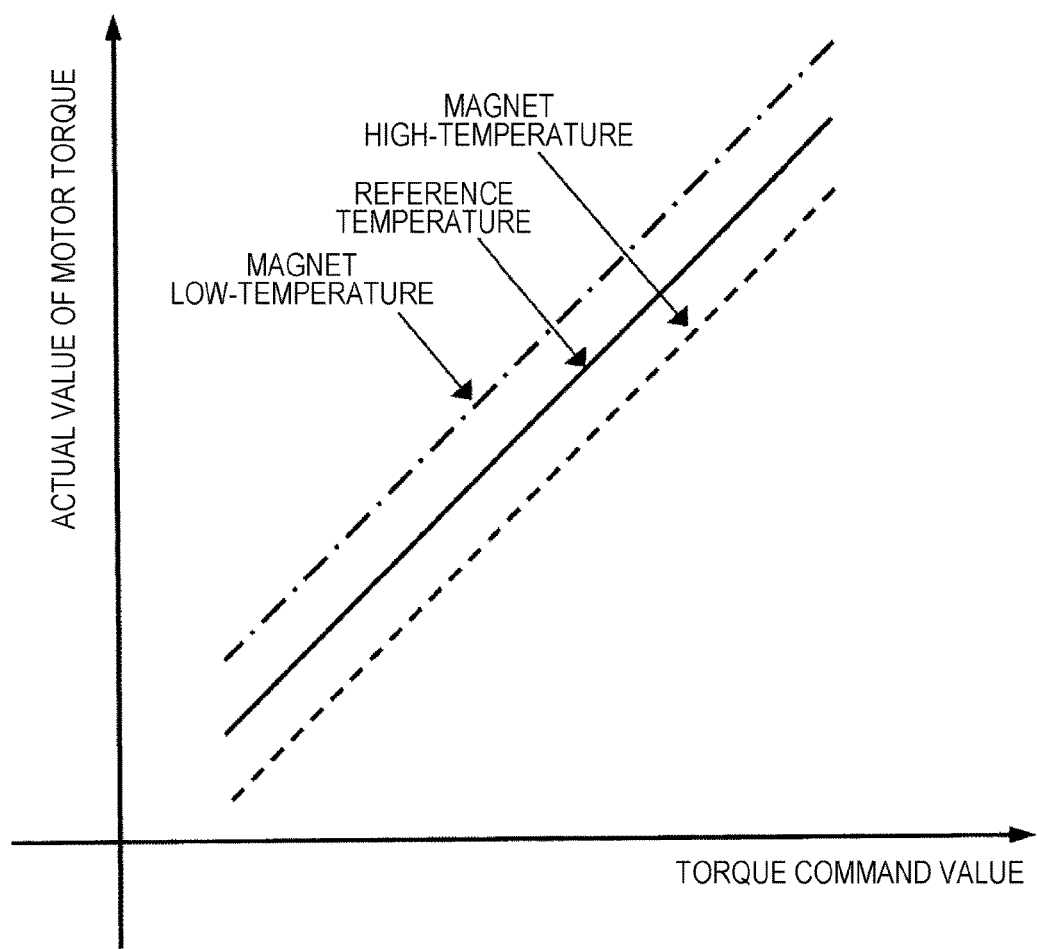
FIG. 10 is a diagram illustrating the temperature dependency of a relation between a torque command and an actual torque when an equal current flows.

FIG. 10 is a graph at each temperature of the permanent magnet illustrating the actual value of the motor torque with respect to the torque command value. It is assumed that the motor current conditions are equal in any case. When the temperature of the permanent magnet is high (high-temperature of the magnet), the motor torque deviates to the lower side in the drawing from the graph of the reference temperature, and the actual torque value becomes smaller than the torque command value. In contrast, when the temperature of the permanent magnet is low (low-temperature of the magnet), the motor torque deviates to the upper side from the graph of the reference temperature, and the actual torque value becomes larger than the torque command value.

Since the value of the torque actually generated varies depending on the temperature of the permanent magnet in this way, it is necessary to estimate the temperature of the permanent magnet and perform a correction calculation such that the torque becomes the target value.

Figure 11:
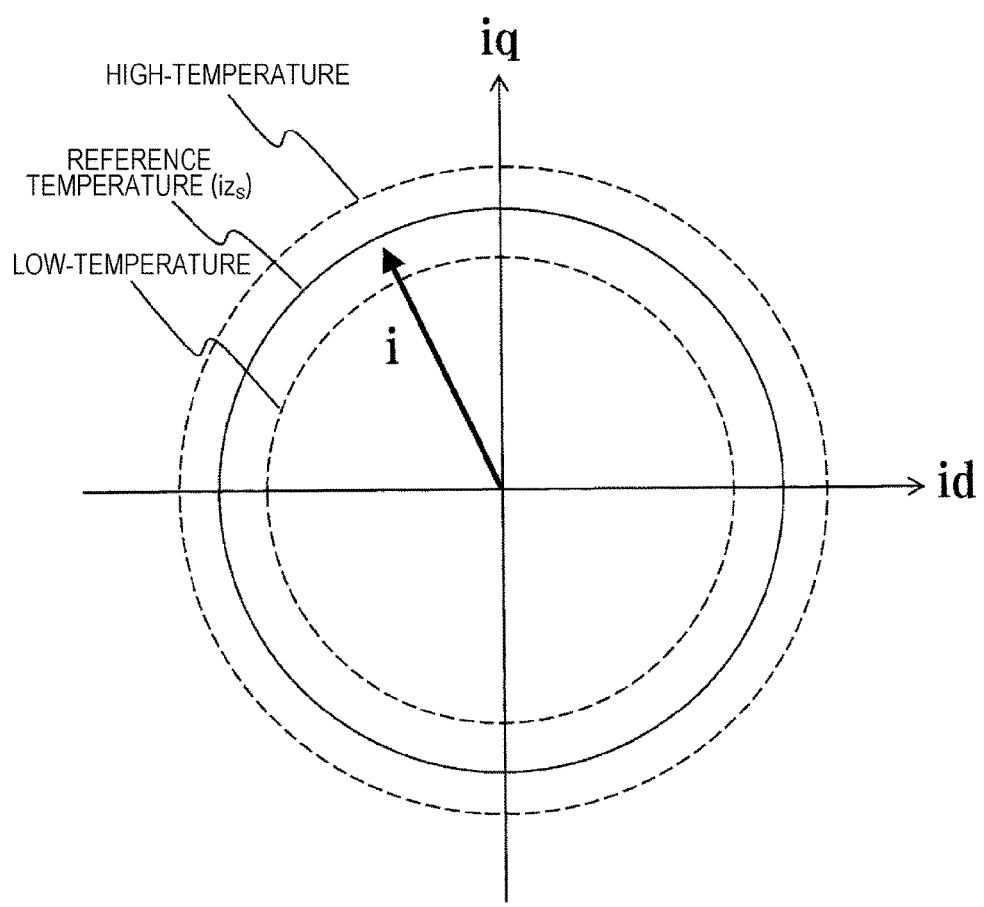
FIG. 11 is a diagram illustrating the control of the first embodiment.

The correction operation will be described with reference to FIG. 11. In the embodiment, the difference between the 0-axis current $i_z$ calculated from the above formula (1) and the reference 0-axis current value $i_{zs}$ that is the 0-axis current value when the temperature of the permanent magnet is the reference temperature is obtained, the current vector i is adjusted to indicate a constant torque even if the temperature of the permanent magnet changes, and the respective phase currents $i_u$, $i_v$, and $i_w$ flowing through the armature winding 102 are controlled.

The correction operation will be further described in detail using the configuration of this embodiment. The inverter control device 300 of the present embodiment performs the torque stabilization control for keeping the torque of the motor 100 constant even if the temperature of the permanent magnet changes as follows.

Figure 12:
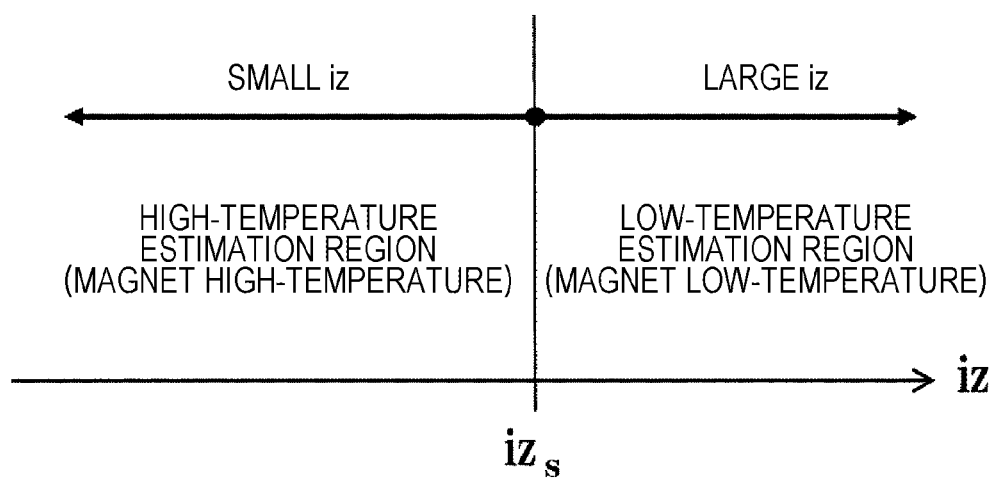
FIG. 12 is a diagram illustrating the determination of the 0-axis current of the first embodiment.

FIG. 12 illustrates a determination criterion of the 0-axis current $i_z$ of the 0-axis current determination unit 306. In the present embodiment, upon receiving the 0-axis current $i_z$ from the 0-axis current calculation unit 305, the 0-axis current determination unit 306 obtains a difference in the 0-axis current $i_z$ with respect to the reference 0-axis current $i_{zs}$, and "outputs the determination signal $S_3$ including information on the difference to the switching signal generation unit 301.

Based on the instruction of the determination signal $S_3$, the switching signal generation unit 301 performs the control to overlap the graph of the torque designation value—motor torque actual value at the reference temperature illustrated in FIG. 10, even when the 0-axis current is large, in other words, even when the magnet temperature is low, and even when the 0-axis current is small, in other words, even when the magnet temperature is high.

That is, the switching signal generation unit 301 outputs the switching signals Gu, Gv, and Gw based on the drive conditions in which a predetermined torque is output at the reference temperature of the permanent magnet, when the 0-axis current $i_z$ is equal to the reference 0-axis current value $i_{zs}$. Further, when the 0-axis current $i_z$ determined to be smaller than the reference 0-axis current $i_{zs}$ and to belong to the high-temperature estimation region, the switching signal generation unit 301 outputs the switching signals Gu, Gv, and Gw for increasing the motor current in accordance with the magnitude of the 0-axis current $i_z$ so that a predetermined torque is output. Further, when the 0-axis current $I_z$ is determined to be larger than the reference 0-axis current $i_{zs}$ and to belong to the low-temperature estimation region, the switching signal generation unit 301 outputs the switching signals Gu, Gv, and Gw for reducing the motor current in accordance with the magnitude of the 0-axis current $i_z$ so that a predetermined torque is output.

Figure 13:
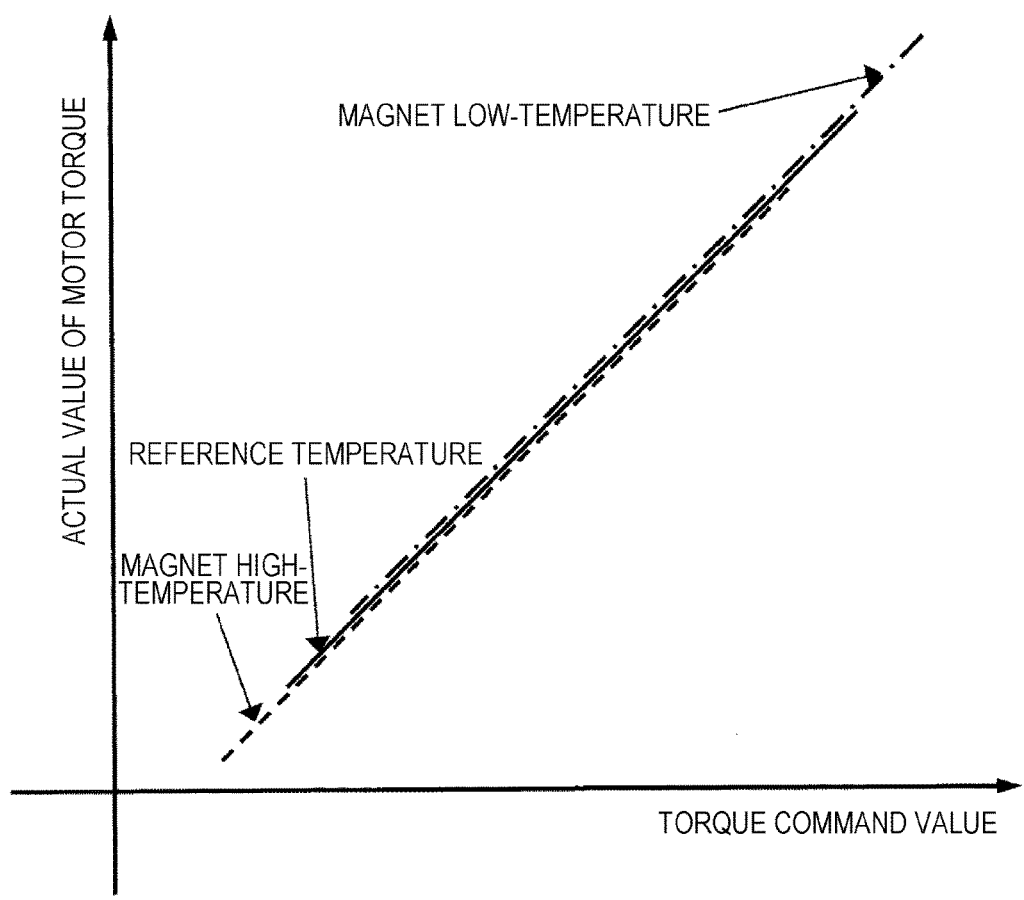
FIG. 13 is a diagram illustrating an effect when performing the control according to the first embodiment.

FIG. 13 illustrates the result of performing the correction control of this embodiment. Through this correction, even if the temperature of the permanent magnet of the motor 100 changes, the torque of the motor 100 can be kept constant.

The motor drive control device of the present embodiment has the following configuration, and has the following operational effects.

(1) The motor drive control device 500 is a motor drive control device of the permanent magnet synchronous motor 100 in which each phase is independently controlled.

The motor drive control device 500 includes a smoothing capacitor 202 interposed between the battery 201 for supplying electric power to the permanent magnet synchronous motor 100 and the permanent magnet synchronous motor 100 to smooth the current, inverters 210a, 210b, and 210c interposed between the smoothing capacitor 202 and the permanent magnet synchronous motor 100 to convert the DC bus current flowing on the smoothing capacitor 202 side into 3-phase motor current and supply the 3-phase motor current to the permanent magnet synchronous motor 100, a 0-axis current calculation unit 305 that calculates and outputs a 0-axis current $i_z$ on the basis of the motor current, a 0-axis current determination unit 306 which compares and determines the reference 0-axis current value $i_{zs}$ when the temperature of the permanent magnet provided in the permanent magnet synchronous motor 100 is the reference temperature with the calculated 0-axis current $i_z$, and a switching signal generation unit 301 which drives and controls the inverters 210a, 210b, and 210c so that motor torque with no temperature dependency is output on the basis of the comparison determination results of the 0-axis current determination unit 306.

Thus, even if the temperature of the permanent magnet of the motor 100 changes, the torque of the motor 100 can be kept constant.

The motor drive control device 500 has the following specific configurations (2) and (3) so as to keep the torque of the motor 100 constant even if the temperature of the permanent magnet of the motor 100 changes.

(2) The 0-axis current determination unit 306 determines a difference in the 0-axis current $I_z$ to the reference 0-axis current value $I_{zs}$.

(3) The switching signal generation unit 301 outputs an inverter drive signal based on the drive condition in which a predetermined torque is output when the 0-axis current $i_z$ matches the reference 0-axis current value $i_{zs}$ and the temperature of the permanent magnet is the reference temperature, in the 0-axis current determination unit 306.

The switching signal generation unit 301 outputs an inverter drive signal for increasing the motor current in accordance with the magnitude of the 0-axis current $i_z$ so that a predetermined torque is output, when the 0-axis current $i_z$ is determined to be smaller than the reference 0-axis current value $I_{zs}$ and to belong to the high-temperature estimation region, in the 0-axis current determination unit 306.

The switching signal generation unit 301 outputs an inverter drive signal for reducing the motor current in accordance with the magnitude of the 0-axis current $i_z$ so that a predetermined torque is output, when the 0-axis current $i_z$ is determined to be larger than the reference 0-axis current value $I_{zs}$ and to belong to the low-temperature estimation region, in the 0-axis current determination unit 306.

Second Embodiment

A motor drive control device 500 of the second embodiment performs the control of preventing irreversible demagnetization of a permanent magnet provided in the motor 100. In describing the second embodiment, description of the same configuration as in the first embodiment will not be provided.

Before describing the motor drive control device 500 of the present embodiment, the irreversible demagnetization will be described.

Figure 14:
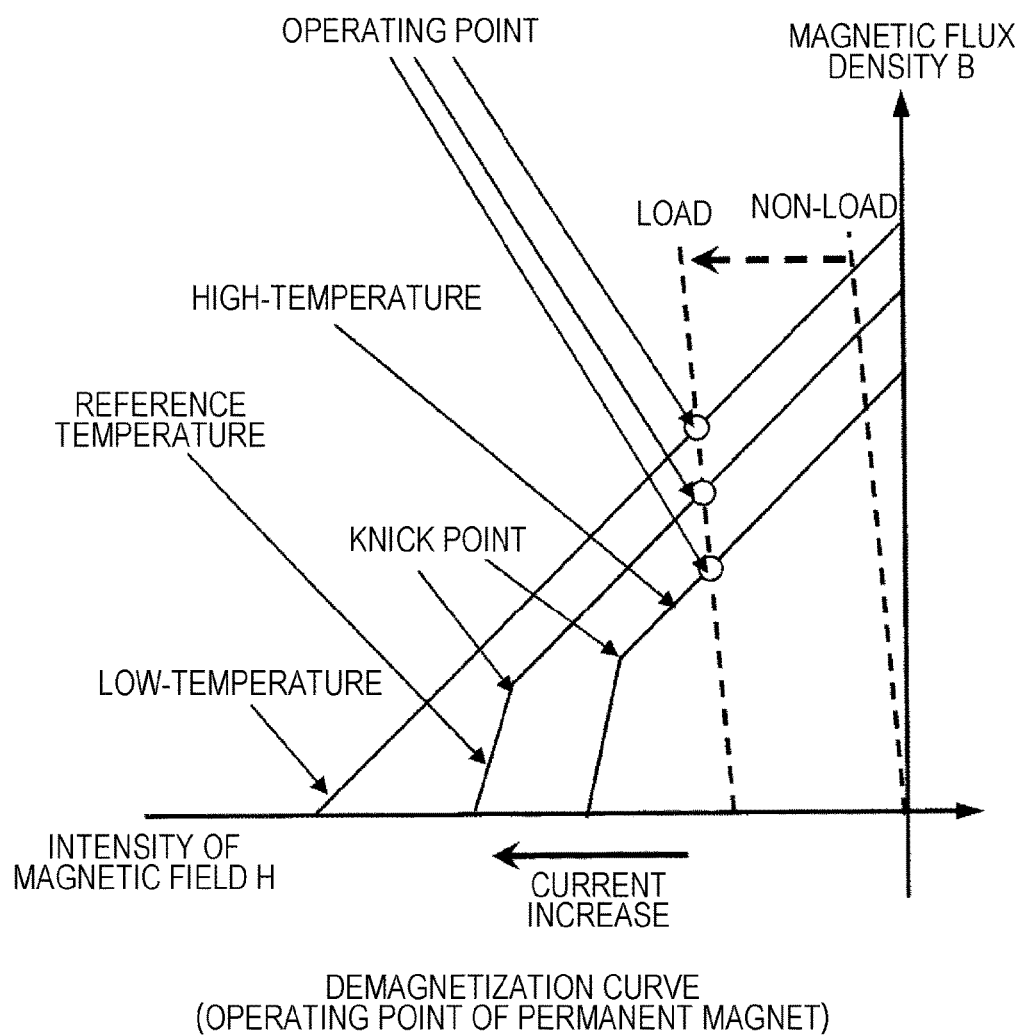
FIG. 14 is a diagram illustrating the operating point of a magnet.

The graph represented by a solid line in FIG. 14 illustrates the demagnetization curve of the permanent magnet provided in the rotor of the motor 100 at each temperature. As illustrated in FIG. 14, the demagnetization curves bend at a point called a knick. Further, the graph illustrated by a broken line in FIG. 14 represents a permeance line of the permanent magnet. The permeance line conducts current to the armature winding 102, that is, moves to the left with a load. An intersection (dashed dot) between the demagnetization curve and the permeance line is called an operating point. When this operating point is located on the left side of the knick of the demagnetization curve, irreversible demagnetization occurs. Since the operating points illustrated in FIG. 14 are all located on the right side of the knick of the demagnetization curve, the irreversible demagnetization does not occur.

Figure 15:
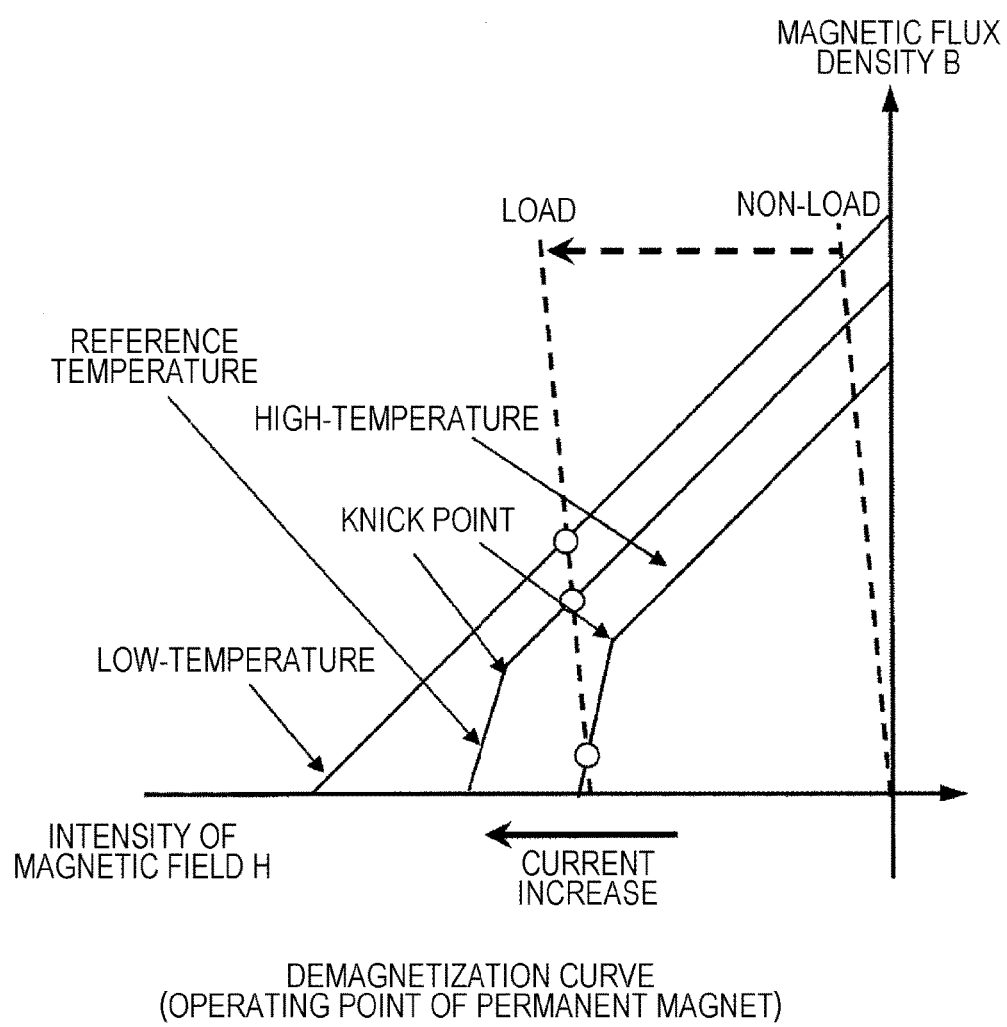
FIG. 15 is a diagram illustrating a state when the operating point of a magnet at a high temperature exceeds a knick point.

FIG. 15 illustrates a state in which an amount of electric conduction, that is, an amount of motor current increases in the armature winding 102. By increasing the amount of motor current, the permeance line moves to the left more than in the case of FIG. 14. As a result, at high temperature, the operating point is located to the left side of the knick of the demagnetization curve. Thus, as the temperature rises, the operating point is easily located to the left side of the knick of the demagnetization curve.

Figure 16:
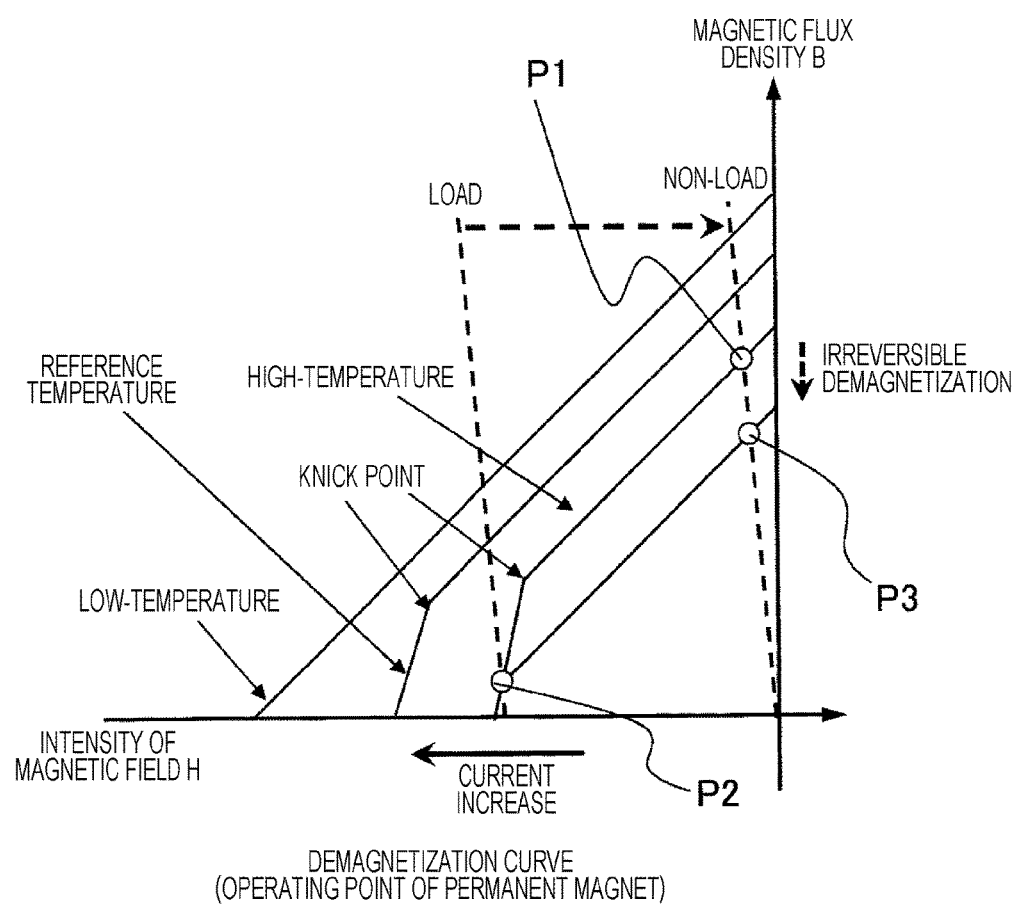
FIG. 16 is a diagram illustrating a state in which an operating point of a magnet at a high temperature exceeds a knick point to cause an irreversible demagnetization.

FIG. 16 illustrates a state in which the amount of motor current is set to zero and no load is set. In FIG. 15, an operating point P2 located on the left side of the knick of the demagnetization curve is located at P3 without returning to the original position P1 illustrated in FIG. 14, even when returning to a no-load state. Irreversible demagnetization is a phenomenon that does not return to the original operating point even when returning to such a no-load state.

In order not to cause such an irreversible demagnetization, it is necessary to estimate the temperature of the permanent magnet.

Figure 17:
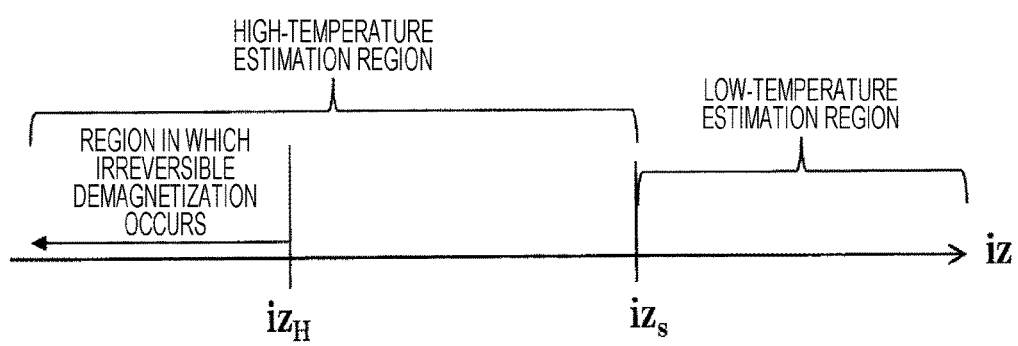
FIG. 17 is a diagram illustrating the determination of the 0-axis current of a second embodiment.

FIG. 17 illustrates the determination criterion of the 0-axis current determination unit 306 of the present embodiment. In the present embodiment, the 0-axis current at the demagnetization temperature in the high-temperature estimation region is based on an irreversible demagnetization prevention 0-axis current $i_{zH}$. When the 0-axis current $i_z$ is equal to or less than the irreversible demagnetization prevention 0-axis current $i_{zH}$, the irreversible demagnetization occurs. The 0-axis current determination unit 306 determines whether or not the 0-axis current $i_z$ is equal to or less than the irreversible demagnetization prevention 0-axis current $i_{zH}$. The determination signal $S_3$ including the determination result is transmitted to the switching signal generation unit 301. If the determination result is determined to be negative, that is, if the 0-axis current $i_z$ is larger than the irreversible demagnetization prevention 0-axis current $i_{zH}$ (unless the 0-axis current $i_z$ is the 0-axis current at the temperature at which the permanent magnet causes the irreversible demagnetization), the switching signal generation unit 301 outputs switching signals Gu, Gv, and Gw based on the drive conditions at the reference temperature of the permanent magnet. Meanwhile, if the determination result is determined to be positive, that is, if the 0-axis current $i_z$ is equal to or less than the irreversible demagnetization prevention 0-axis current $i_{zH}$ (if the 0-axis current $i_z$ is the 0-axis current at a temperature in which the permanent magnet causes the irreversible demagnetization), the switching signal generation unit 301 imposes restrictions so as not to cause the irreversible demagnetization of the permanent magnet, and outputs the switching signals Gu, Gv, and Gw for reducing the motor currents $i_u$, $i_v$, and $i_w$.

Figure 18:
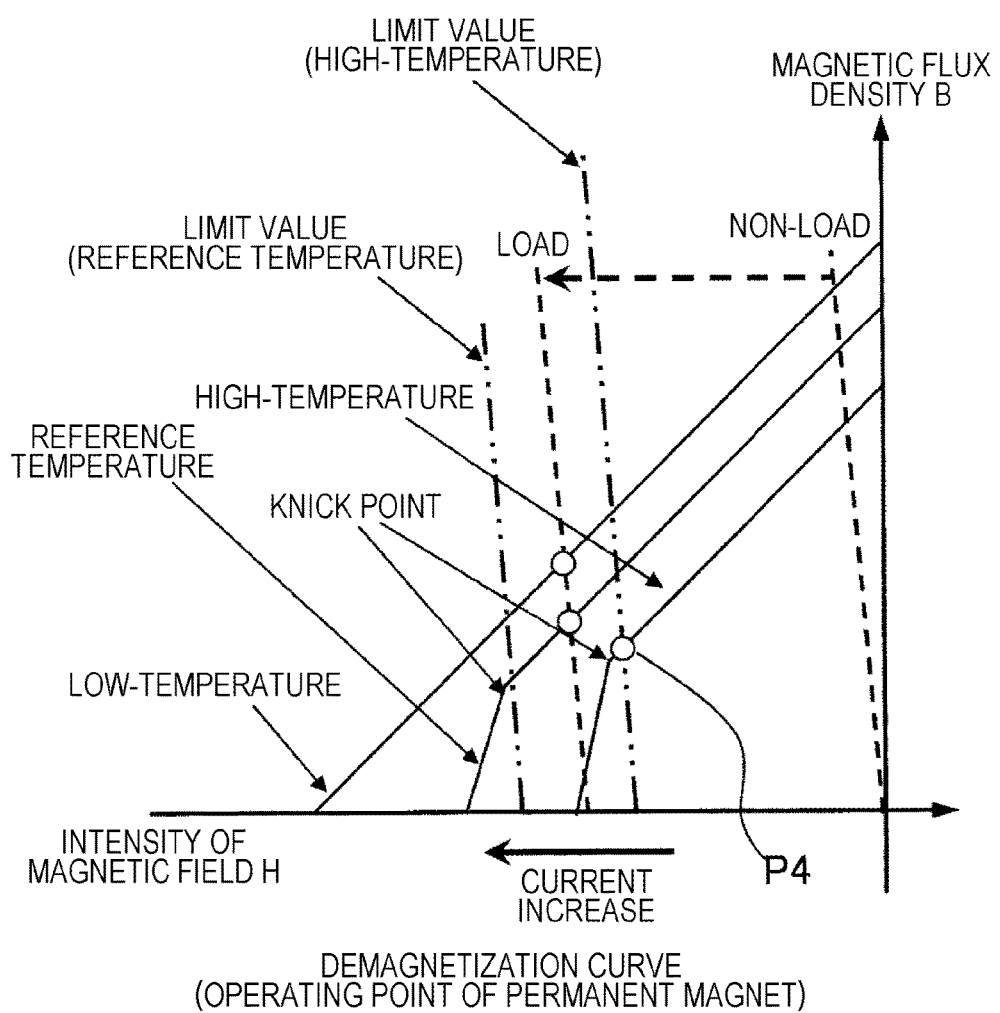
FIG. 18 is a diagram illustrating an effect when performing the control according to the second embodiment.

FIG. 18 illustrates a state when the control (irreversible demagnetization prevention control) of the present embodiment is applied. In "low-temperature" and "reference temperature" illustrated in FIG. 18, since the 0-axis current $i_z$ is determined to be larger than the irreversible demagnetization prevention 0-axis current $i_{zH}$, the same control as in FIG. 15 is performed. As in FIG. 15, irreversible demagnetization does not occur under the above control in the "low-temperature" and the "reference temperature". Meanwhile, at the "high-temperature" illustrated in FIG. 18, since the 0-axis current $i_z$ is determined to be equal to or less than the irreversible demagnetization prevention 0-axis current $i_{zH}$, the motor current is limited, and an electric conduction control represented by a permeance line of "limit value (high-temperature)" in FIG. 18 is performed. As a result, the operating point P is located on the right side of the knick point, and the irreversible demagnetization can be prevented even at a high temperature. In this way, by performing the irreversible demagnetization prevention control of the present embodiment, it is possible to prevent the irreversible demagnetization of the permanent magnet provided in the rotor of the motor 100.

The motor drive control device of the present embodiment has the following configuration, and exhibits the following operational effects.

(1) The motor drive control device 500 is a motor drive control device of the permanent magnet synchronous motor 100 in which each phase is independently controlled.

The motor drive control device 500 has a smoothing capacitor 202 interposed between the battery 201 for supplying electric power to the permanent magnet synchronous motor 100 and the permanent magnet synchronous motor 100 to smooth the current, inverters 210a, 210b, and 210c interposed between the smoothing capacitor 202 and the permanent magnet synchronous motor 100 to convert the DC bus current flowing on the smoothing capacitor 202 side into 3-phase motor currents and to supply the 3-phase motor currents to the permanent magnet synchronous motor 100, a 0-axis current calculation unit 305 that calculates and outputs a 0-axis current $i_z$ on the basis of the motor current, a 0-axis current determination unit 306, and a switching signal generation unit 301 which drives and controls the inverters 210a, 210b, and 210c so as not to cause irreversible demagnetization of the permanent magnets on the basis of the result of the comparison determination of the 0-axis current determination unit 306.

Therefore, it is possible to prevent the irreversible demagnetization of the permanent magnet of the motor 100.

The motor drive control device 500 has the following specific configuration (2) so as to prevent irreversible demagnetization of the permanent magnet of the motor 100.

(2) When the motor 100 is driven under the drive condition when the temperature of the permanent magnet of the motor 100 is the reference temperature, the 0-axis current determination unit 306 determines whether the calculated 0-axis current $i_z$ is a 0-axis current at a temperature at which the permanent magnet causes the irreversible demagnetization.

The switching signal generation unit 301 outputs the inverter drive signal based on the drive condition when the temperature of the permanent magnet is the reference temperature, if the determination result is determined to be negative.

The switching signal generation unit 301 outputs an inverter drive signal that reduces the motor current so as not to cause irreversible demagnetization of the permanent magnet, if the determination result is determined to be positive.

Third Embodiment

The motor drive control device 500 of the third embodiment performs a torque stabilization control for keeping the torque of the motor 100 constant, and an irreversible demagnetization prevention control for preventing the irreversible demagnetization of a permanent magnet provided in the motor 100. When the two controls have opposite effects, the irreversible demagnetization prevention control is prioritized. In describing the third embodiment, the description of the same configuration as that of the first embodiment will not be provided.

Figure 19:
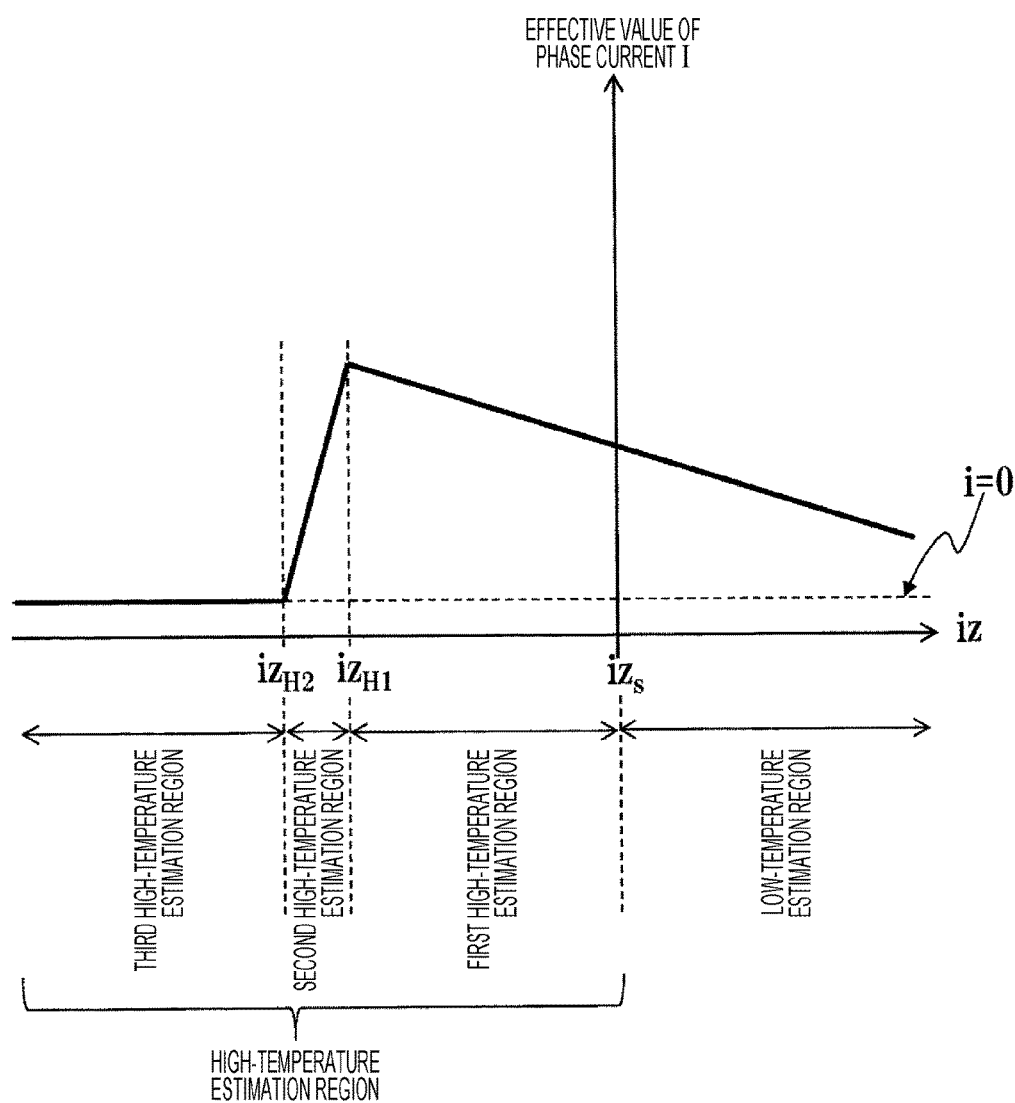
FIG. 19 is a diagram illustrating the determination and the control of the 0-axis current of a third embodiment.

FIG. 19 illustrates the current effective value I of each phase flowing through the motor 100 with respect to the 0-axis current value.

In the present embodiment, the control is performed using both the torque stabilization control of the first embodiment and the irreversible demagnetization prevention control of the second embodiment. As illustrated in FIG. 19, in the present embodiment, the high-temperature estimation region is divided into three regions. A first high-temperature estimation region, a second high-temperature estimation region, and a third high-temperature estimation region are named from the side having the large 0-axis current value (that is, the side having lower temperature estimated by the 0-axis current). In the present embodiment, the torque stabilization control of the first embodiment is performed from the low-temperature estimation region to the first high-temperature estimation region, the permanent magnet is at a very high temperature in the third high-temperature estimation region, and the operation of the motor is immediately stopped to prevent the irreversible demagnetization. In the second high-temperature estimation region located between the first high-temperature estimation region and the third high-temperature estimation region, in order to prevent the irreversible demagnetization, the magnitude of the current effective value I is limited depending on the magnitude of the 0-axis current $i_z$. This is to prevent the irreversible demagnetization. In the second high-temperature estimation region, if the torque stabilization control as in the first high-temperature estimation region is performed, since the current effective value I becomes larger than the electric conduction at the reference temperature, the irreversible demagnetization occurs even at a temperature in which the irreversible demagnetization does not occur in the electric conduction at the reference temperature. Therefore, in the second high-temperature estimation region, as described above, the control is performed to limit the magnitude of the current effective value I depending on the magnitude of the 0-axis current $i_z$. Therefore, the irreversible demagnetization can be prevented.

With the control of the present embodiment as described above, it is possible to stabilize the torque until a certain temperature, while preventing the irreversible demagnetization.

The motor drive control device of the present embodiment has the following configuration, and exhibits the following operational effects.

(1) The motor drive control device 500 is a motor drive control device of the permanent magnet synchronous motor 100 in which each phase is independently controlled.

The motor drive control device 500 has a smoothing capacitor 202 interposed between the battery 201 for supplying electric power to the permanent magnet synchronous motor 100 and the permanent magnet synchronous motor 100 to smooth the current, inverters 210a, 210b, and 210c interposed between the smoothing capacitor 202 and the permanent magnet synchronous motor 100 to convert the DC bus current flowing on the smoothing capacitor 202 side into 3-phase motor currents and to supply the 3-phase motor currents to the permanent magnet synchronous motor 100, a 0-axis current calculation unit 305 which calculates and outputs the 0-axis current $i_z$ on the basis of the motor current, a 0-axis current determination unit 306 which compares and determines the reference 0-axis current value $i_{zs}$ when the temperature of the permanent magnet provided in the permanent magnet synchronous motor 100 is the reference temperature with the calculated 0-axis current, a switching signal generation unit 301 which drives and controls the inverters 210a, 210b, and 210c so that the irreversible demagnetization of the permanent magnet is not generated, and the motor torque with no temperature dependency is output until a predetermined temperature, on the basis of the results of the comparison determination of the 0-axis current determination unit 306.

As a result, even if the temperature of the permanent magnet of the motor 100 changes, the torque of the motor 100 can be kept constant, and even if the temperature of the permanent magnet of the motor 100 changes, torque of the motor 100 can be kept constant until a predetermined temperature.

Even if the temperature of the permanent magnet of the motor 100 changes, the motor drive control device 500 can keep the torque of the motor 100 constant, and even if the temperature of the permanent magnet of the motor 100 changes, in order to keep the torque of the motor 100 constant until a predetermined temperature, the motor drive control device 500 has the following specific configuration (2).

(2) The 0-axis current determination unit 306 determines as to which region of the low-temperature estimation region and the first to third high-temperature estimation regions the 0-axis current $i_z$ belongs.

The switching signal generation unit 301 outputs an inverter drive signal based on the drive condition in which a predetermined torque is output when the permanent magnet is at the reference temperature, when the 0-axis current $i_z$ is determined to belong to one of the low-temperature estimation region and the first high-temperature estimation region.

The switching signal generation unit 301 outputs an inverter drive signal for reducing the motor current so as to prioritize the prevention of occurrence of irreversible demagnetization of the permanent magnet rather than the output of the predetermined torque, when the 0-axis current $i_z$ is determined to belong to the second high-temperature estimation region.

The switching signal generation unit 301 outputs an inverter drive signal for setting the motor current to zero to stop the operation of the motor so as not to cause irreversible demagnetization of the permanent magnet, when the 0-axis current $i_z$ is determined to belong to the third high-temperature estimation region.

Combinations of the following modified examples with the inventions described in the first to third embodiments are also within the scope of the present invention.

First Modified Example

Figure 20:
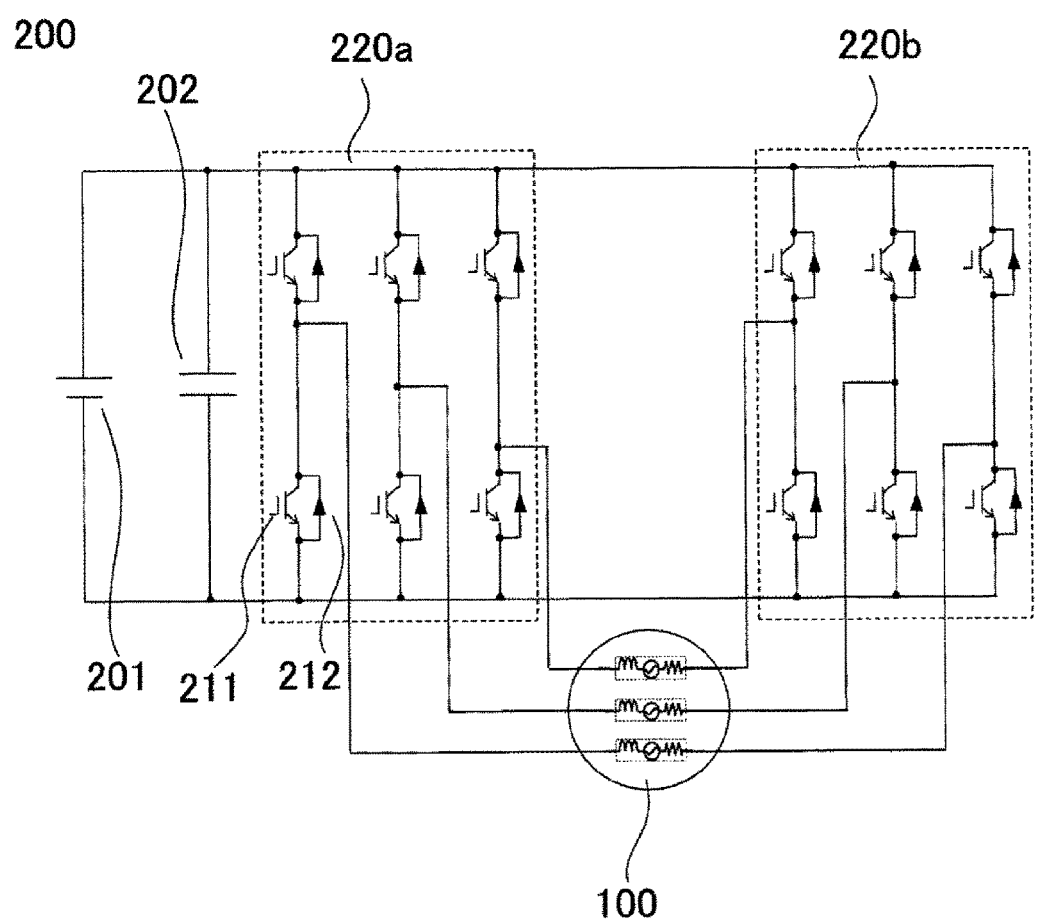
FIG. 20 is a diagram illustrating a first modified example.

FIG. 20 illustrates an inverter of the first modified example. In this modified example, instead of the full bridge inverters 210a, 210b, and 210c illustrated in FIG. 1, one ends of the armature windings 102a, 102b, and 102c of each phase of the motor 100 are connected to the 3-phase inverter 220a using the switching elements including an IGBT 221 and a diode 222, and the other ends thereof are connected to the 3-phase inverter 220b. Even with such modification, the same effect can be obtained. Although the arrangement of the windings of the motor 100 of FIG. 20 is different from that of FIG. 1, this is for the sake of simplicity and is the same as in FIG. 1.

Second Modified Example

Figure 21:
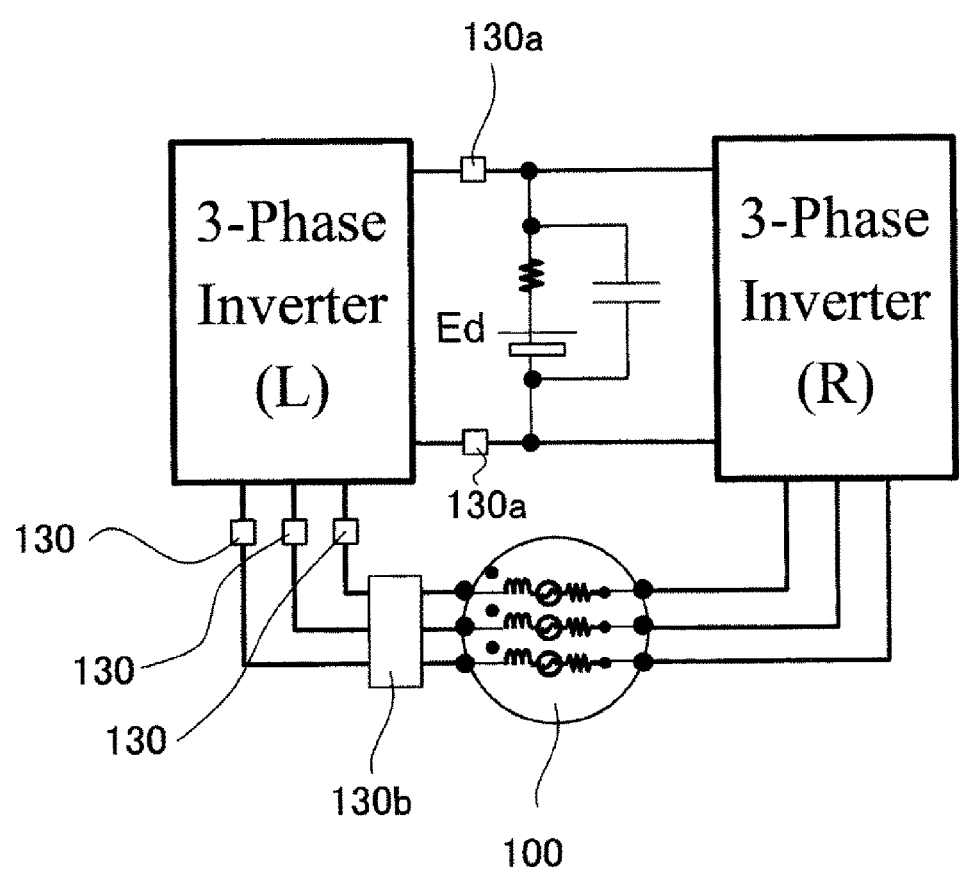
FIG. 21 is a diagram illustrating a second modified example.

FIG. 21 illustrates a modified example (second modified example) of the method for detecting the current for obtaining the 0-axis current $i_z$. The method for individually detecting the values of the current detection unit 130 of each phase illustrated in FIG. 21 corresponds to that illustrated in FIG. 1. As another detection method, there is a method for detecting the current (DC bus current) for obtaining the 0-axis current $i_z$ by providing the current detection unit 130a in the DC bus bar of the positive side or the negative side of the bus bar. Further, there is a method for detecting the current for obtaining the 0-axis current $i_z$ by providing a current detection unit 130b which collectively passes through 3-phases. In either method, since the current information required by the above formula (1) can be obtained, the 0-axis current $i_z$ can be obtained.

Further, it is also possible to detect the current for obtaining the 0-axis current $i_z$ by the above method, perform Fourier transformation on the obtained 0-axis current $i_z$, obtain respective order components of harmonics, and compare the order components with the reference value to control the current.

Third Modified Example

Figure 22:
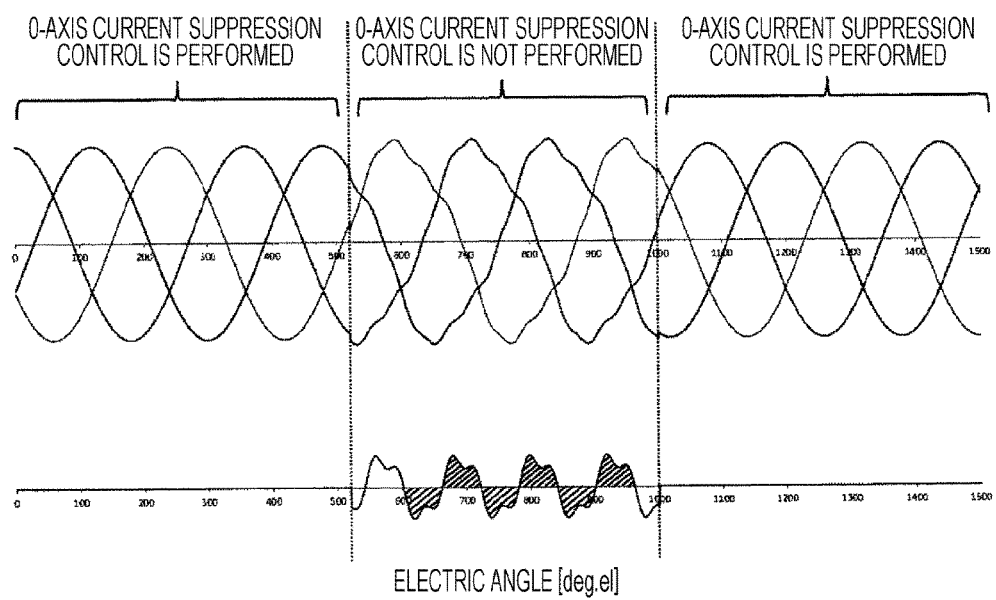
FIG. 22 is a diagram illustrating a third modified example.

FIG. 22 illustrates a modified example (third modified example) on the determination material relating to the 0-axis current $i_z$. As illustrated in FIG. 22, the waveform area of the 0-axis current $i_z$ can be used as a determination material. Even in this way, the same effect can be obtained.

Fourth Modified Example

Figure 23:
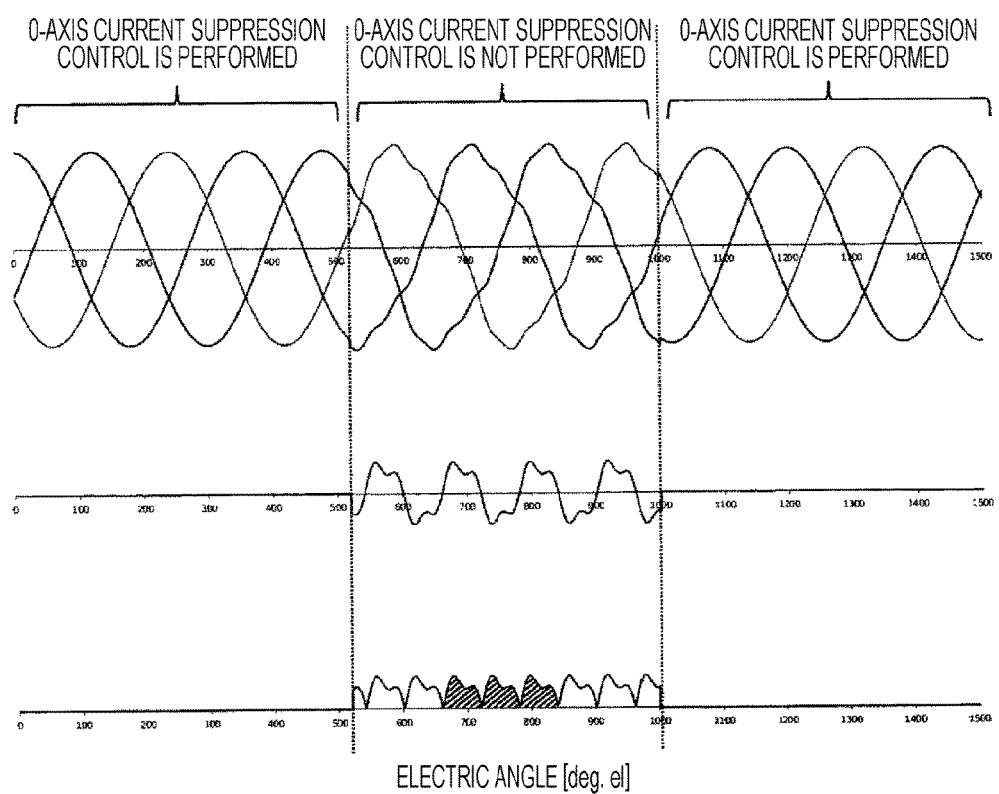
FIG. 23 is a diagram illustrating a fourth modified example.

FIG. 23 illustrates a modified example (fourth modified example) on the determination material relating to the 0-axis current $i_z$. As illustrated in FIG. 23, the effective value of the 0-axis current $i_z$ can be used as a determination material. Even in this way, the same effect can be obtained.

Fifth Modified Example

Figure 24:
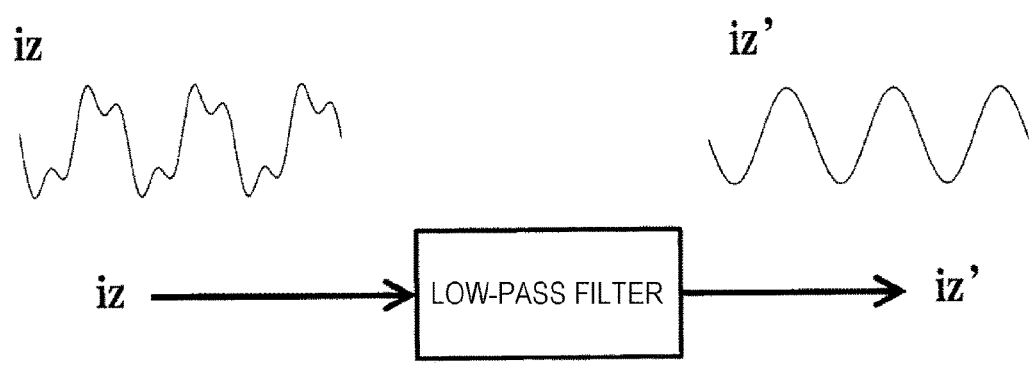
FIG. 24 is a diagram illustrating a fifth modified example.

FIG. 24 illustrates a modified example (fifth modified example) on the determination material relating to the 0-axis current $i_z$. As illustrated in FIG. 24, the maximum value of the principal component obtained by making the 0-axis current $i_z$ pass through a low-pass filter can be used as a determination material. Even in this way, the same effect can be obtained.

In the above description, the embodiment of the present invention has been described by a 3-phase 6-wire type permanent magnet synchronous motor, but the present invention is not limited thereto. The present invention can also be similarly applied to an n-phase 2n-wire type permanent magnet synchronous motor (n is an integer of 2 or more). The n-phase 2n-wire type permanent magnet synchronous motor is a motor capable of independently controlling each phase as illustrated in FIG. 1 as an example.

The present invention is not limited to the aforementioned contents. Other aspects considered within the technical idea of the present invention are also included within the scope of the present invention.

In other words, the present invention is a device for driving and controlling a permanent magnet synchronous motor in which each phase is independently controlled. Any aspect may be used as long as it is a device which includes a 0-axis current calculation unit (for example, a 0-axis current calculation unit 305) which calculates and outputs a 0-axis current on the basis of one of a motor current and a DC bus current, a comparison determination unit (for example, a 0-axis current determination unit 306) which compares and determines the reference 0-axis current value which is the 0-axis current value when the temperature of the permanent magnet provided in the permanent magnet synchronous motor is a reference temperature with the calculated 0-axis current, and a drive control unit (for example, a switching signal generation unit 301) which drives and controls the inverter on the basis of the comparison determination results of the comparison determination unit.

REFERENCE SIGNS LIST

100 motor (permanent magnet synchronous motor)
102 armature winding
102a U-phase armature winding
102b V-phase armature winding
102c W-phase armature winding 105 motor output shaft
110 magnetic pole position detection device
130 current detection unit
130a current detection unit which reads DC current
132b current detection unit which collectively reads 3-phase current
201 battery
202 smoothing capacitor
210a U-phase full bridge inverter
210b V-phase full bridge inverter
210c W-phase full bridge inverter
211 IGBT
212 diode
220a, 220b 3-phase inverter
300 inverter control device
301 switching signal generation unit
302 torque command unit
303 0-axis current suppression command unit
305 0-axis current calculation unit
306 0-axis current determination unit
500 motor drive control device

The invention claimed is:

1. A motor drive control device of a permanent magnet synchronous motor in which each phase is independently controlled, the motor drive control device comprising:
  a smoothing capacitor interposed between a battery configured to supply electric power to the permanent magnet synchronous motor and the permanent magnet synchronous motor to smoothen the current;
  an inverter interposed between the smoothing capacitor and the permanent magnet synchronous motor to convert a DC bus current flowing on the smoothing capacitor side into a multiphase motor current and supply the multiphase motor current to the permanent magnet synchronous motor;
  a current detection unit which detects one of the motor current and the DC bus current;
  a 0-axis current calculation unit which calculates and outputs a 0-axis current on the basis of the current detected by the current detection unit;
  a comparison determination unit which determines a reference 0-axis current value, the reference 0-axis current value being a 0-axis current value when the temperature of a permanent magnet provided in the permanent magnet synchronous motor is a reference temperature, and compares the reference 0-axis current value with the calculated 0-axis current; and
  a drive control unit which drives and controls the inverter on the basis of the result of the comparison determination of the comparison determination unit,
  wherein, when a region of the 0-axis current value at a temperature lower than the reference temperature is defined as a low-temperature estimation region, and a region of the 0-axis current value at a temperature higher than the reference temperature is defined as first to third high-temperature estimation regions (here, a high-low relation of the temperature of each region is the first high-temperature estimation region<the second high-temperature estimation region<the third high-temperature estimation region),
  the comparison determination unit determines as to which region of the low-temperature estimation region and the first to third high-temperature estimation regions the 0-axis current belongs,
  the drive control unit outputs an inverter drive signal based on a drive condition in which a predetermined torque is output when the temperature of the permanent magnet is at the reference temperature, when the 0-axis current is determined to belong to one of the low-temperature estimation region and the first high-temperature estimation region,
  the drive control unit outputs an inverter drive signal for reducing the motor current so as to prioritize the prevention of occurrence of irreversible demagnetization of the permanent magnet rather than the output of the predetermined torque, when the 0-axis current is determined to belong to the second high-temperature estimation region, and
  the drive control unit outputs an inverter drive signal which sets the motor current to zero so as not to cause irreversible demagnetization of the permanent magnet, when the 0-axis current is determined to belong to the third high-temperature estimation region.

2. The motor drive control device according to claim 1, further comprising:
  a calculation unit which calculates a magnitude of the 0-axis current with respect to the reference 0-axis current value,
  wherein the drive control unit outputs an inverter drive signal based on a drive condition in which a predetermined torque is output when the temperature of the permanent magnet is a reference temperature in a case where the 0-axis current coincides with the reference 0-axis current value,
  the drive control unit outputs an inverter drive signal for increasing the motor current in accordance with the magnitude of the calculated 0-axis current so that the predetermined torque is output, when the 0-axis current is smaller than the reference 0-axis current value, and
  the drive control unit outputs an inverter drive signal for reducing the motor current in accordance with the magnitude of the calculated 0-axis current so that the predetermined torque is output, when the 0-axis current is larger than the reference U-axis current value in the comparison determination unit.

3. The motor drive control device according to claim 1, wherein, when the permanent magnet synchronous motor is driven under a drive condition when the temperature of the permanent magnet of the permanent magnet synchronous motor is at the reference temperature, the comparison determination unit determines whether the calculated 0-axis current is a 0-axis current at a temperature at which the permanent magnet causes the irreversible demagnetization,
  the drive control unit outputs an inverter drive signal based on the drive condition at the reference temperature of the permanent magnet, if the determination result is determined to be negative, and
  the drive control unit outputs an inverter drive signal that reduces the motor current so as not to cause irreversible demagnetization of the permanent magnet, when the determination result is determined to be positive.

4. The motor drive control device according to claim 1, further comprising:
  a 0-axis current suppression command unit which outputs a 0-axis current suppression command to the drive control unit so that a 0-axis current suppression control for suppressing the 0-axis current included in the motor current is executed,
  wherein the 0-axis current suppression command unit does not output the 0-axis current suppression control command, when the current detection unit detects a current to calculate the 0-axis current.

5. The motor drive control device according to claim 1, wherein the current detection unit individually detects the current of each phase of the motor current.

6. The motor drive control device according to claim 1, wherein the current detection unit collectively detects the current of each phase of the motor current.

7. The motor drive control device according to claim 1, wherein the current detection unit detects the DC bus current.

8. The motor drive control device according to claim 4, wherein the current detection unit increases the frequency of detecting the current for calculating the 0-axis current as the torque or the output of the permanent magnet synchronous motor increases.

\* \* \* \* \*